United States Patent
Tsunashima et al.

(10) Patent No.: US 7,361,960 B1
(45) Date of Patent: Apr. 22, 2008

(54) SEMICONDUCTOR DEVICE AND METHOD OF MANUFACTURING THE SAME

(75) Inventors: Yoshitaka Tsunashima, Yokohama (JP); Kiyotaka Miyano, Tokyo (JP); Yukihiro Ushiku, Yokohama (JP)

(73) Assignee: Kabushiki Kaisha Toshiba, Kawasaki-Shi (JP)

( * ) Notice: Subject to any disclaimer, the term of this patent is extended or adjusted under 35 U.S.C. 154(b) by 0 days.

(21) Appl. No.: 09/688,989

(22) Filed: Oct. 17, 2000

Related U.S. Application Data

(62) Division of application No. 09/105,958, filed on Jun. 29, 1998, now Pat. No. 6,184,083.

(30) Foreign Application Priority Data

Jun. 30, 1997 (JP) ................................... 9-174205
Jun. 30, 1997 (JP) ................................. 10-185453
Feb. 24, 1998 (JP) ................................. 10-042056

(51) Int. Cl.
*H01L 29/76* (2006.01)
*H01L 31/00* (2006.01)

(52) U.S. Cl. ................ 257/380; 257/393; 257/410; 257/411; 257/903

(58) Field of Classification Search ................ 257/380, 257/393, 903, 904, 410, 411
See application file for complete search history.

(56) References Cited

U.S. PATENT DOCUMENTS

| | | | |
|---|---|---|---|
| 4,445,267 A * | 5/1984 | De La Moneda et al. | 438/275 |
| 5,188,976 A * | 2/1993 | Kume et al. | 435/2 |
| 5,254,489 A | 10/1993 | Nakata | 437/40 |
| 5,289,422 A | 2/1994 | Mametani | 365/210 |
| 5,327,002 A * | 7/1994 | Motoyoshi | 257/380 |
| 5,464,783 A * | 11/1995 | Kim et al. | 437/42 |
| 5,496,771 A * | 3/1996 | Cronin et al. | 437/187 |
| 5,497,021 A * | 3/1996 | Tada | 257/369 |

(Continued)

FOREIGN PATENT DOCUMENTS

JP 2-3244 1/1990

(Continued)

OTHER PUBLICATIONS

Stanley Wolf, Silicon Processing for the Vlsi Era, vol. I pp. 581 and vol. II pp.238-239. (1986,Ed.).

*Primary Examiner*—Howard Weiss
*Assistant Examiner*—Shrininvas H. Rao
(74) *Attorney, Agent, or Firm*—Finnegan, Henderson, Farabow, Garrett & Dunner, L.L.P.

(57) ABSTRACT

A first insulator film and a first polysilicon film are formed on first and second element regions of a semiconductor substrate. The first insulator film and first polysilicon film are removed from the second element region. A second insulator film is formed on the second element region from which the first insulator film and first polysilicon film are removed, and a second polysilicon film is formed on the second insulator film. The first polysilicon film is processed, forming a first gate electrode at the first element region. The second polysilicon film is processed, forming a second gate electrode at the second element region. A silicon nitride film is removed from an element-isolation region. A metal film is formed on the region from which the silicon nitride film has been removed, and connects the first and second gate electrodes.

7 Claims, 36 Drawing Sheets

U.S. PATENT DOCUMENTS 5,502,009 A    3/1996  Lin .............................. 437/239
5,677,563 A *  10/1997 Cronin et al. ................ 257/506
5,792,696 A    8/1998  Kim et al. ................... 438/258

FOREIGN PATENT DOCUMENTS

| JP | 3-184368 | 8/1991 |
| JP | 4-123439 | 4/1992 |
| JP | 4-225531 | 8/1992 |
| JP | 6-232152 | 8/1994 |
| JP | 8-213481 | 8/1996 |
| JP | 8-264531 | 10/1996 |

* cited by examiner

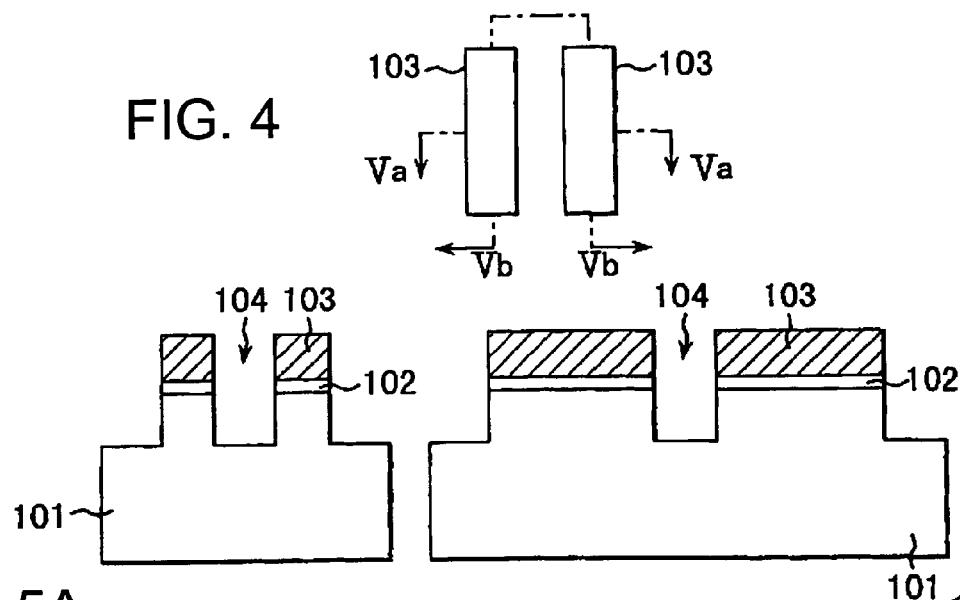
FIG. 4
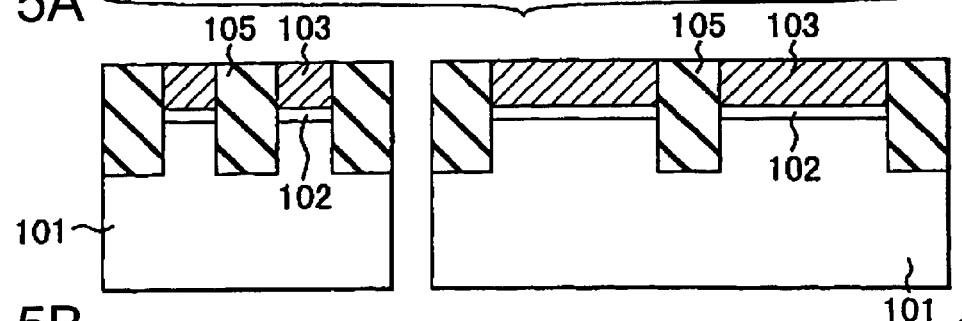
FIG. 5A
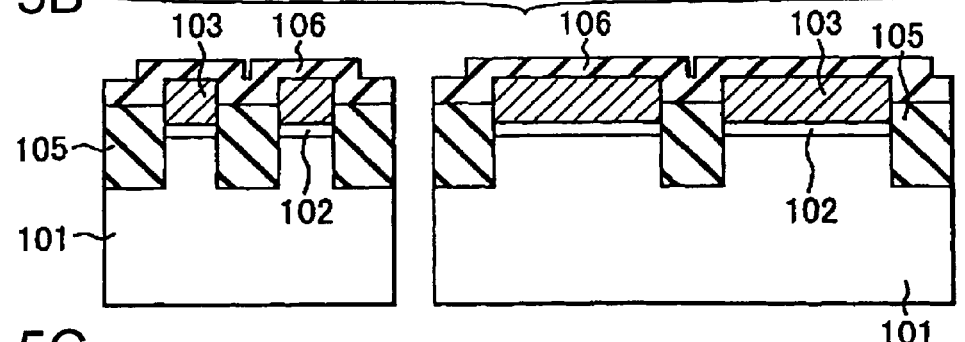
FIG. 5B
FIG. 5C
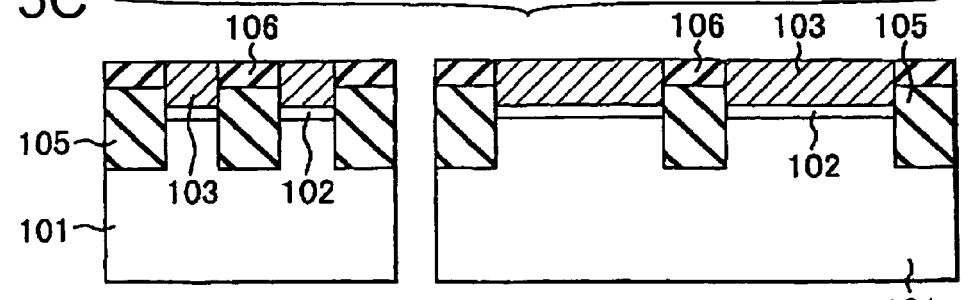
FIG. 5D FIG. 6
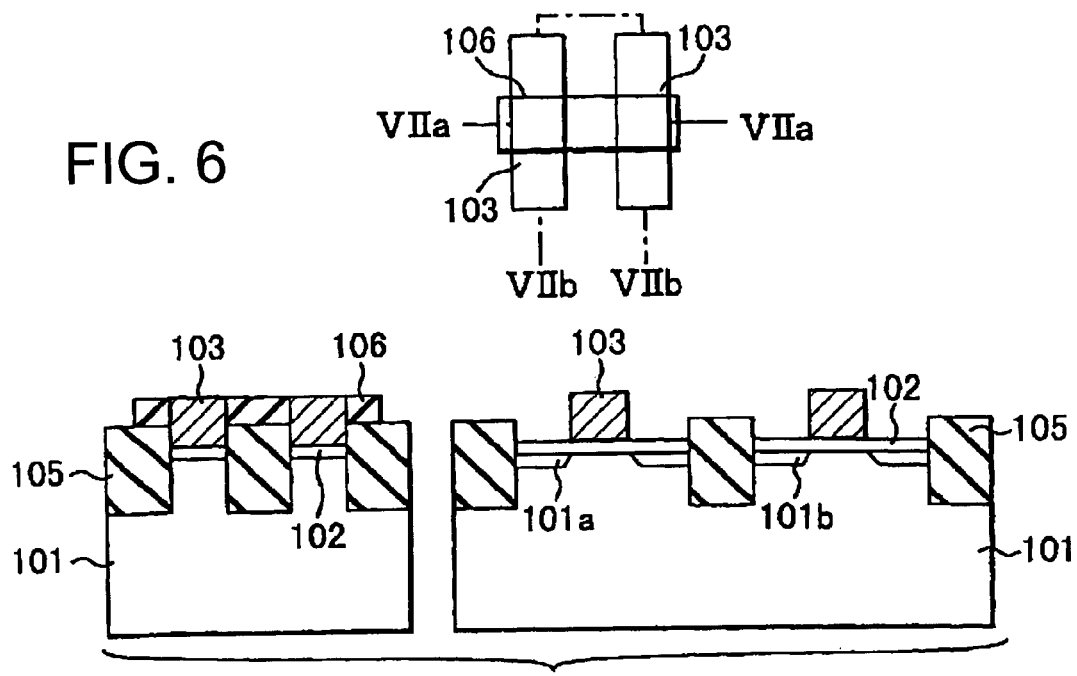
FIG. 7A
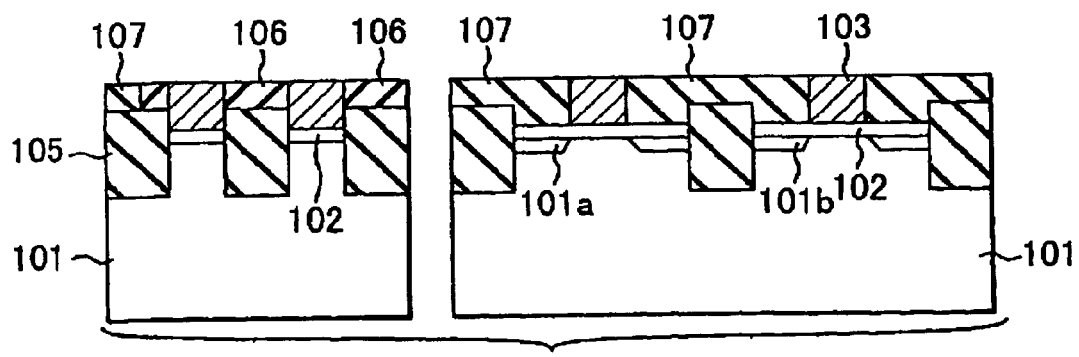
FIG. 7B
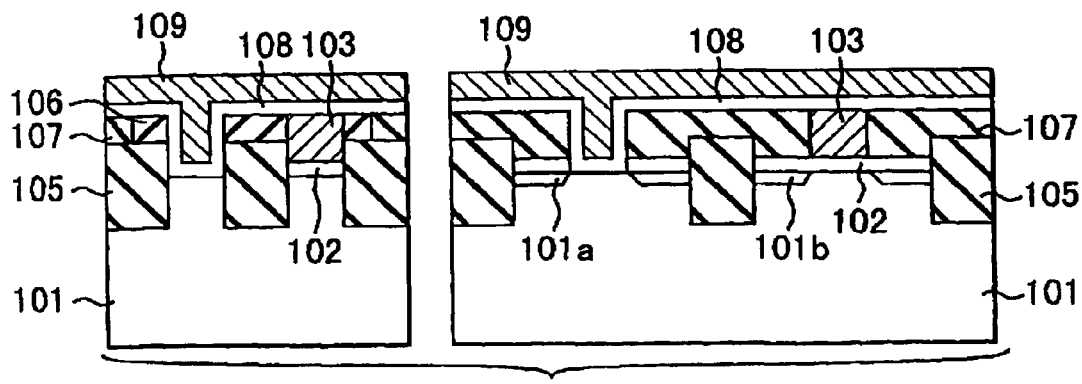
FIG. 7C

100

SEMICONDUCTOR DEVICE AND METHOD OF MANUFACTURING THE SAME

This is a division of application Ser. No. 09/105,958 filed Jun. 29, 1998, now U.S. Pat. No. 6,184,083, which is incorporated herein by reference.

BACKGROUND OF THE INVENTION

The present invention relates to a semiconductor device and a method of manufacturing the device. More particularly, it relates to a semiconductor device comprising gate oxide films and/or gate electrodes formed on the same substrate, made of different materials and/or being different in thickness, and also to a method of manufacturing this semiconductor device.

Hitherto, the transistors incorporated in an LSI (Large-scale Integration) circuit device such as a DRAM (Dynamic Random Access Memory) have a gate insulator film having a uniform thickness in most cases. LSIs incorporating transistors having such a gate insulator film are advantageous in two respects. First, they can be manufactured by a simple method and, hence, at low cost. Second, they can be manufactured with a high yield. However, they have but low operating efficiency, inevitably because they can not incorporate high-speed transistors recently developed.

In recent years, it is required that two types of gate insulator films or gate electrodes be formed on the same substrate. This is because, in the case where two or more different power-supply voltages are applied in the circuits formed in the same semiconductor substrate, the gate insulator films of the transistors provided in a high-voltage circuit section must be thick to render the circuit section reliable. For example, the gate insulator films of the transistors incorporated in DRAM or EPROM (Electrically Erasable and Programmable Read-Only Memory) cells are made thicker than the gate insulator films of the other circuit sections.

Most CMOS (Complementary Metal Oxide Semiconductor) circuits hitherto made include n+ polysilicon gates. To have a threshold voltage of PMOS (P-channel MOS) transistor controlled appropriately, each PMOS transistor has so-called buried channel structure. With this element structure it has become difficult to suppress the short-channel effect of the PMOS transistor. In this respect, a so-called dual-gate structure is considered in PMOS more desirable than the buried channel structure.

In a CMOS circuit of the dual-gate structure, the gate electrode of each PMOS transistor is made of p+ polysilicon, and the gate electrode of each NMOS (N-channel MOS) transistor is made of n+ polysilicon.

The circuit of the dual-gate structure can operate more efficiently, if the gate insulator films differ in thickness.

Generally, a surface region of the substrate is divided into two regions by means of photolithography in preparation for forming two types of gate insulator films or gate electrodes on the same substrate. An example will be described below.

After forming a trench isolation in the surface region of a semiconductor substrate, a thermal oxide film is formed on the substrate by means of thermal oxidation. Next, a photoresist is coated on the entire surface of the substrate. That part of the photoresist in which a PMOS region is formed, is removed; the photoresist remains on only an NMOS region. Using the photoresist thus patterned as a mask, that part of the thermal oxide film, which is formed on the PMOS region, is removed by etching. Further, the photoresist is removed from the NMOS region, and thermal oxidation is performed on the substrate again, thereby forming a thermal oxide film on the entire upper surface of the resultant structure. Since the thermal oxide film formed by the first thermal oxidation remain on the NMOS region, the NMOS region is now covered with a thicker oxide film than the PMOS region.

In the process described above, however, the gate oxide film on the NMOS region directly contacts the photoresist. The photoresist contains much impurities, such as Na and heavy metals, which deteriorate the quality of the gate insulator film provided on the NMOS region. The impurities may diffuse into the gate oxide film formed on the NMOS in the following oxidation steps. If so, the reliability and yield of the element formed in the NMOS region are decreased.

Another method of manufacturing a conventional semiconductor device will be described, with reference to FIG. 1, FIGS. 2A to 2F, and FIGS. 3A to 3E.

FIG. 1 is a schematic plan view of a conventional semiconductor device. As shown in FIG. 1, the device comprises an trench isolation 1, a gate wiring region 2, and diffusion regions 3a and 3b. A first transistor is provided on the diffusion region 3a, and a second transistor on the diffusion region 3b. The gate insulator films of these transistors are made of different materials and/or have different thicknesses. The gate electrodes of these transistors are made of different materials and/or have different thicknesses.

FIGS. 2A to 2F are sectional views, each consisting of a right section and a left section, taken along line IIa-IIa and line IIb-IIb in FIG. 1, respectively. In other words, FIGS. 2A to 2F are sectional views explaining the steps of manufacturing the first transistor in the right sections, and the steps of manufacturing the second transistor in the left sections. FIGS. 3A to 3E are sectional views, all taken along line III-III in FIG. 1.

At first, a well region (not shown) and an isolation 11 of STI (Shallow Trench Isolation) structure are formed in a silicon substrate 10. Thereafter, a first gate oxide film 12 is formed on the substrate 10 by means of thermal oxidation. A polysilicon film 13, which will be processed into a first gate electrode, is formed on the first gate oxide film 12 by means of a CVD (Chemical Vapor Deposition) method. Dopant impurities are added to the polysilicon film 13 while the film 13 is being formed, or ion-implanted into the film 13 after the film 13 has been formed (see FIGS. 2A and 3A).

Next, the polysilicon film 13 is patterned by means of lithography and dry etching, forming a pattern covering only the region in which the first transistor will be formed. Diluted hydrofluoric acid solution is applied to that part of the first gate oxide film 12 which is exposed. As a result, this part of the film 12 is etched away, exposing a part of the silicon substrate 10 (see FIGS. 2B and 3B).

A second gate insulator film 14 is formed on the parts, thus exposed, of the silicon substrate 10 by means of thermal oxidation. At the same time, the top and sides of the polysilicon film 13, i.e., the first gate electrodes, are also oxidized. Hence, the silicon oxide film 14 covers the top and sides of the polysilicon film 13, as well as the exposed parts of the substrate 10. A polysilicon film 15, i.e., the second gate electrode, is formed on the silicon oxide film 14 by means of CVD method (see FIGS. 2C and 3C).

Thereafter, the second polysilicon film 15 is patterned, by means of lithography and dry etching, forming a pattern covering only the region in which the second transistor will be formed. Diluted hydrofluoric acid solution is applied to that part of the second gate oxide film 14 which is exposed.

As a result, this art of the film 14 is etched away, exposing a part of the silicon substrate 10 (see FIGS. 2D and 3D).

A tungsten silicide (WSi$_2$) film 16 is formed on the entire upper surface of the resultant structure (see FIGS. 2E and 3E). The film 16 will be processed into a third gate electrode 5 which connects the first and second gate electrodes.

Next, the tungsten silicide film 16 and the polysilicon films (first and second gate electrodes) are processed into gate wires by means of lithography and dry etching (see FIGS. 2F and 3E).

Thereafter, steps of ordinary types, such as post oxidation, remaining side walls, forming of sources and drains and metalization, are carried out. The first and second transistors are thereby formed, which have gate oxide films different in thickness.

The semiconductor integrated circuit manufactured by the conventional method described above is disadvantageous in the following respects.

First, the first gate electrode 13 and the second gate electrode 15 must be overlapped at the junction for a distance W, as shown in FIG. 3E, due to the insufficient alignment margin available in the photolithography. The channel regions of the transistors, which are active regions, must be spaced away from the junction of the gate electrodes 13 and 15. Hence, the trench-isolation is inevitably broad by the distance W for which the gate electrodes 13 and 15 overlap at the junction. This results in an increase in the size of the whole device, a reduction in the number of chips that can be cut from one silicon wafer, and ultimately in an increase in the manufacturing cost of the semiconductor integrated circuit device.

Second, the surface of the semiconductor integrated circuit (the tungsten silicide (WSi$_2$) film 16) is not flat and has different heights, as shown in FIG. 3E. This complicates the lithography and dry etching that are carried out to form the gate wires. It would be difficult for the semiconductor integrated circuit device to have elements which are as small as is designed.

BRIEF SUMMARY OF THE INVENTION

Accordingly, it is an object of the present invention to provide a semiconductor device which comprises gate oxide films and/or gate electrodes formed on the same substrate, made of different materials and/or being different in thickness, and also a method of manufacturing this semiconductor device.

According to a first aspect of the present invention, there is provided a method of manufacturing a semiconductor device, comprising the following steps of:
  forming a first film and a second film at a plurality of regions on a substrate at which gate electrodes are to be formed;
  removing the first film and the second film from at least one of the plurality of regions; and
  forming a first insulator film and a first gate electrode at the at least one of the plurality of regions from which the first film and the second film have been removed.

In the method according to the first aspect, the step of forming the first film and the second film comprises the sub-steps of:
  forming a second insulator film surrounding the plurality of regions, the second insulator film having an upper surface located at a level lower than an upper surface of the second film;
  forming a third film on the second insulator film;
  removing a part of the third film, thereby leaving the first film and the second film on the plurality of regions and leaving the third film around the plurality of regions; and
  forming a source region and a drain region in the substrate, and
the step of forming the first insulator film and the first gate electrode comprises the sub-steps of:
  forming a third insulator film at the regions from which the third film have been removed; and
  forming the first gate electrode on the first insulator film and above the region from which the first insulting film and the second film have been removed,
whereby the first gate electrode is formed above the at least one of the plurality of regions, and a second gate electrode made of the second film is formed above a region other than the at least one of the plurality of regions.

Further in this method, the step of forming the first insulator film and the first gate electrode includes sub-steps of removing the other parts of the third film being left and forming a conductive film on the regions from which the other parts of the third film have been removed, the conductive film connecting the first gate electrode and the second gate electrode.

In the method according to the first aspect, the step of forming the first film and the second film comprises the sub-steps of:
  forming a second insulator film surrounding the plurality of regions, the second insulator film having an upper surface located at a level lower than an upper surface of the second film;
  forming a third film on the second insulator film;
  removing parts of the third film, thereby leaving the first film and the second film on the plurality of regions and leaving the other parts of the third film around the regions; and
  forming a source region and a drain region in the substrate, and
the step of forming the first insulator film and the first gate electrode comprises the sub-steps of:
  forming a third insulator film on the regions from which parts of the third film have been removed;
  forming the first insulator film in the region from which the first insulting film and the second film have been removed; and
  forming the first gate electrode on the first insulator film, and
the method further comprises a step of removing the first film and second film from the plurality of regions except at least one of the plurality of regions, thereby forming a fourth insulator film on the regions from which the first film and second film have been removed and forming a second gate electrode on the fourth insulator film,
wherein the first gate electrode is formed above the at least one of the plurality of regions, and the second gate electrode is formed above a region other than the at least one of the plurality of regions.

Further in this method, the step of forming the first insulator film and the first gate electrode includes sub-steps of removing the other parts of the third-film being left and forming a conductive film on the regions from which the other parts of the third film have been removed, the conductive film connecting the first gate electrode and the second gate electrode.

In the method according to the first aspect, the step of forming the first film and the second film includes sub-steps of:

forming the first film and the second film on an entire surface of the substrate;

forming a third film on the second film;

patterning the plurality of regions, thereby forming a dummy wiring section; and forming an insulating layer surrounding the dummy wiring section, and the step of forming the first insulator film and the first gate electrode comprises the sub-steps of:

masking the plurality of regions, except at least one region, and removing the first film, second film and third film from the at least one of the plurality of regions; and forming the first insulator film and the first gate electrode of the at least one of the plurality of regions, from which the first film, second film and third film have been removed.

This method further comprises the step of removing the third film from the plurality of regions, except at least one of the plurality of regions, after the first insulator film and first gate electrode have been formed on the at least one of the plurality of regions, forming a second gate electrode on the second film formed on the regions from which the third film has been removed, thereby forming a first gate electrode made of the first gate electrode on the at least one of the plurality of regions and forming a second gate electrode made of the second gate electrode on the plurality of regions, except the at least one of the plurality of regions.

In the method according to the first aspect, the step of forming the first film and the second film includes sub-steps of:

forming the first film and the second film on an entire surface of the substrate;

forming a third film on the second film;

patterning the plurality of regions, thereby forming a dummy wiring section; and forming an insulating section surrounding the dummy wiring section, and the step of forming the first insulator film and the first gate electrode comprises the sub-steps of:

removing the first film, second film and third film from at least one of the plurality of regions;

forming the first insluting film on the at least one of the plurality of regions;

removing the third film form the plurality of regions, except the at least one of the plurality of regions; and forming the first gate electrode on the plurality of regions.

According to a second aspect of the present invention, there is provided a method of manufacturing a semiconductor device, comprising the steps of:

forming a first gate insulator film on a semiconductor substrate;

forming a first gate film on the first gate insulator film and forming a second film on the first gate film, thereby forming a composite film composed of the first gate film and the second film;

patterning the composite film, thereby forming a plurality of regions where gate electrodes are to be formed;

forming an insulating section surrounding the plurality of regions;

masking at least one of the plurality of regions and removing the second film from the plurality of regions, except the at least one of the plurality of regions; and forming a second gate film on the at least one of the plurality of regions, from which the second film has been removed.

According to a-third aspect of the present invention, there is provided a semiconductor device comprising:

a semiconductor substrate;

a first transistor formed in a surface region of the substrate and including a first insulator film and a first gate electrode;

a second transistor formed in a surface region of the substrate and including a second insulator film and a second gate electrode; and a connection section formed on the substrate and between the first and second gate electrodes and electrically connecting sides of the first and second gate electrodes, wherein the first and second insulator films constitute a set and the first and second gate electrodes constitute another set, elements of at least one of the two sets are different, the first and second insulator films are different in at least one of thickness, material and material composition, the first and second gate electrodes are different in at least one of material and material composition and a part of a side of the first gate electrode is connected to a part of a side of the second gate electrode.

According to a fourth aspect of the present invention, there is provided a semiconductor device comprising:

a semiconductor substrate;

a first transistor formed on a first region of the substrate and including a first insulator film and a first gate electrode; and a second transistor formed on a second region of the substrate and including a second insulator film and a second gate electrode, the second region being adjacent to the first region, wherein the first and second insulator films constitute a set and the first and second gate electrodes constitute another set, elements of at least one of the two sets are different, the first and second insulator films are different in at least one of thickness, material and material composition, the first and second gate electrodes are different in at least one of material and material composition and a part of a side of the first gate electrode is connected to a part of a side of the second gate electrode.

According to a fifth aspect of the present invention, there is provided a semiconductor device comprising:

a substrate;

first and second gate insulator films formed on the substrate, the first and second gate insulator films having different thickness and/or being made of different materials; and first and second gate electrodes formed on the first and second gate insulator films, the first and second gate electrodes having different thickness and/or being made of different materials, wherein a sum of heights of the first gate insulator film and the first gate electrode equals to a sum of heights of the second gate insulator film and the second gate electrode.

The present invention provides a semiconductor device which comprises gate oxide films and/or gate electrodes formed on the same substrate, made of different materials and/or being different in thickness, and provides also a method of easily manufacturing this semiconductor device. In particular, the present invention provides a semiconductor device, in which damascene gates are formed and no photoresist therefore contacts the gate insulator film and in which the junction between any adjacent gate electrodes has only a small area.

In the present invention, the junction between any adjacent gate electrodes need not be broad or protruded portions are not formed as in the semiconductor device manufactured by the conventional method. Thus, the present invention provides a semiconductor integrated circuit device which can operate with high reliability and at high speed.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4 is a plan view of the substrate of a semiconductor device being made, explaining a method of manufacturing the device, according to a first embodiment of the present invention;

FIGS. 5A to 5D are sectional views, explaining some of the steps of the method according to the first embodiment, each view consisting of a right section taken along line Va-Va shown in FIG. 4 and a left section taken along line Vb-Vb shown in FIG. 4;

FIG. 6 is a plan view of the substrate of the semiconductor device being made, explaining the method according to the first embodiment of the present invention;

FIGS. 7A to 7F are sectional views, explaining some other steps of the method according to the first embodiment, each view consisting of a right section taken along line VIIa-VIIa shown in FIG. 6 and a left section taken along line VIIb-VIIb shown in FIG. 6;

DETAILED DESCRIPTION OF THE INVENTION

Figure 1:
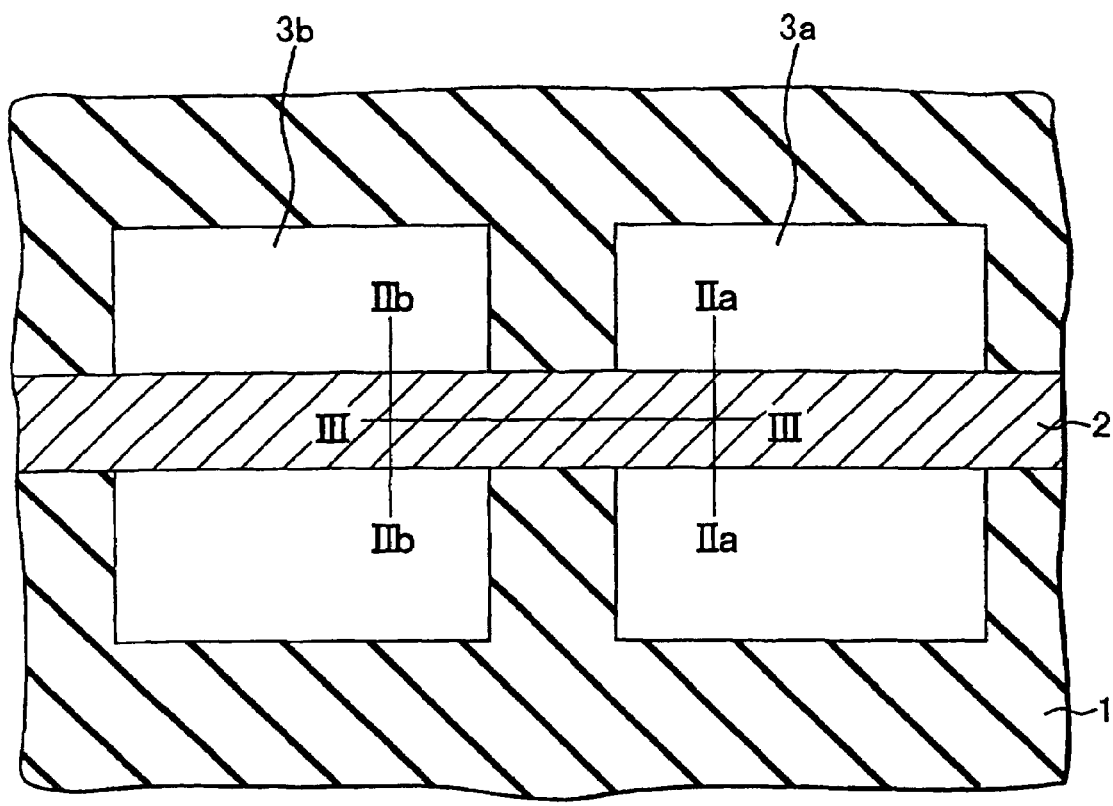
FIG. 1 is a plan view of a semiconductor device comprising gate electrodes made of different materials and/or being different in thickness and gate insulator films made of different materials and/or being different in thickness, all formed on the same substrate.
Figure 2A:
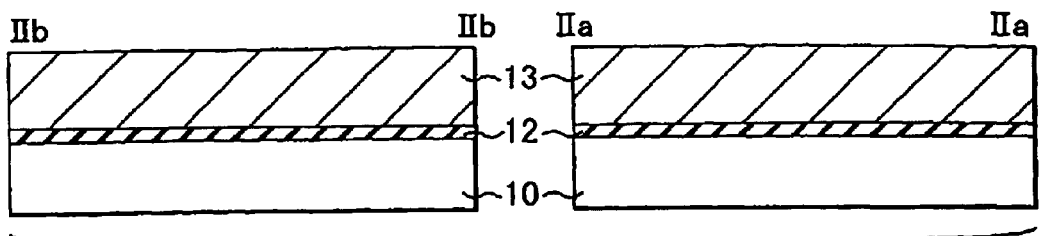
FIGS. 2A to 2F are sectional views, explaining a conventional method of manufacturing the semiconductor device shown in FIG. 1 each view consisting of a right section taken along line IIa-IIa shown in FIG. 1 and a left section taken along line IIb-IIb shown in FIG. 1.
Figure 2B:
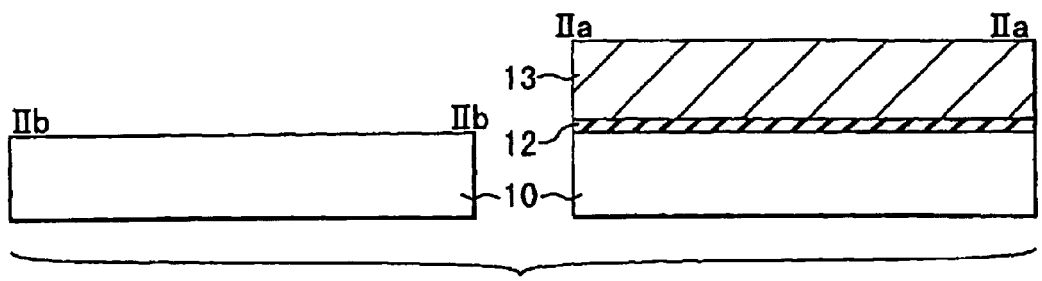
Figure 2C:
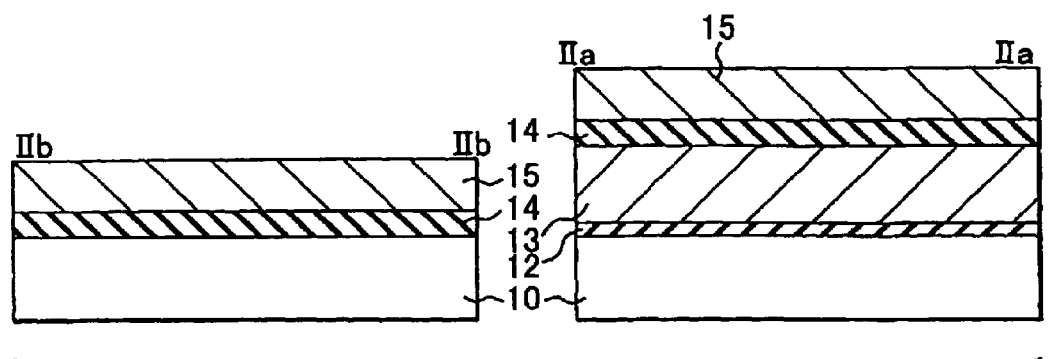
Figure 2D:
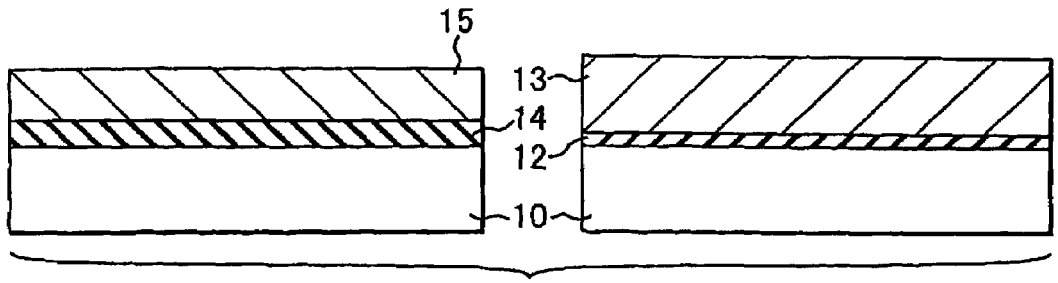
Figure 2E:
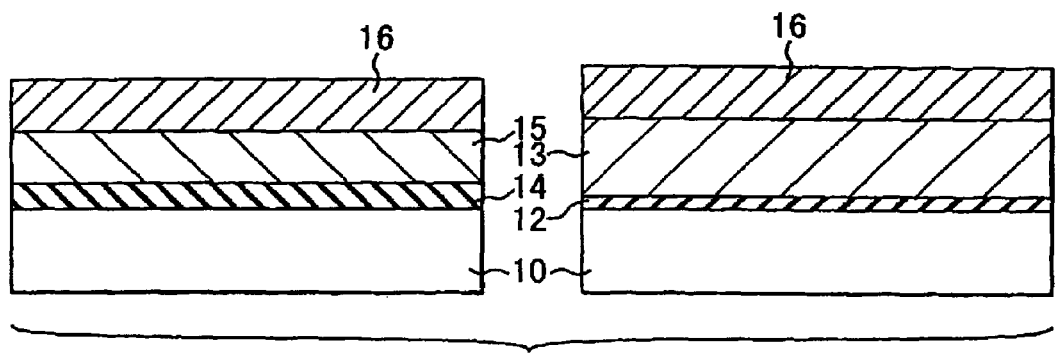
Figure 2F:
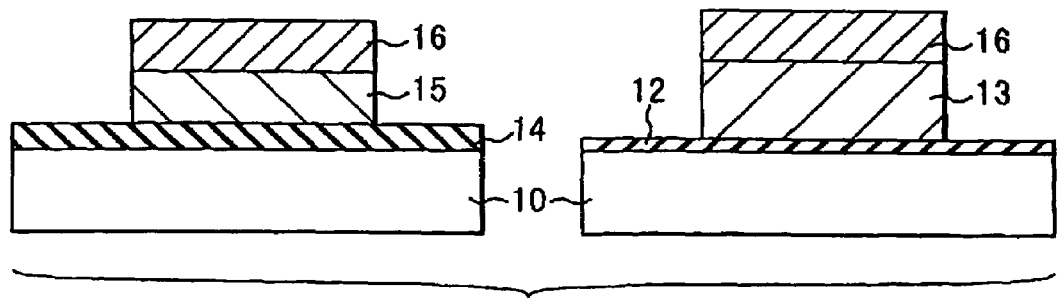

A preferred embodiment of a semiconductor device according to the present invention will now be described with reference to the accompanying drawings.

First Embodiment

The first embodiment of the present invention will be described, with reference to FIG. 4, FIGS. 5A to 5D, FIG. 6, and FIGS. 7A to 7F.

FIG. 4 is a plan view of the substrate of a semiconductor device during manufacturing with the method according to the first embodiment. FIGS. 5A to 5D are sectional views explaining some steps of the method of manufacturing a semiconductor device, according to the first embodiment of the present invention. Each of FIGS. 5A to 5D consists of a right section taken along line Va-Va shown in FIG. 4 and a left section taken along line Vb-Vb shown in FIG. 4.

FIG. 6 is a plan view of a substrate of the final product according to the first embodiment of the present invention. FIGS. 7A to 7F are sectional views, explaining some other steps of the method according to the first embodiment. Each of FIGS. 7A to 7F consists of a right section taken along line VIIa-VIIa shown in FIG. 6 and a left section taken along line VIIb-VIIb shown in FIG. 6.

At first, as shown in FIGS. 4 and 5A, a thermal oxide film 102 (first insulator film) having a thickness of 6 nm is formed on the entire upper surface of a silicon substrate 101. An n+ polysilicon film 103 (first material film) having a thickness of 20 nm is stacked on the thermal oxide film 102 by means of CVD (Chemical Vapor Deposition) method. A photoresist is then coated on the n+ polysilicon film 103. Photolithography is performed, patterning the photoresist, thus forming a photoresist pattern on element regions. Using the photoresist pattern as a mask, the polysilicon film 103, thermal oxide film 102 and silicon substrate 101 are etched by RIE (Reactive Ion Etching) method. A groove 104 having a depth of 30 nm is thereby made in the silicon substrate 101.

Next, as shown in FIG. 5B, an insulator film 105 (second insulator film) is deposited on the entire surface of the resultant structure, filling the groove 104, by means of CVD method or the like. Heat treatment is carried out at 1000° C., making the insulator film 105 dense (densification). The insulator film 105 is then removed by CMP (Chemical Mechanical Polishing) method, except that part filling the groove 104. The insulator film 105 is made of silicon oxide in most cases. Instead, the film 105 may be made of SiN, alumina, $TiO_2$, organic glass, or the like.

Then, as shown in FIG. 5C, an upper portion of the insulator film 15 which is not buried in the grooves 104 is removed by RIE method, reducing the thickness of the film 105 by about 10 nm. A grooves is thereby formed in the substrate 101. CVD method is carried out, forming a silicon nitride film 106 (SiN film, or second material film), which is thicker than the depth of the groove.

Next, as shown in FIG. 5D, the SiN film 106 is removed by CMP method, except the part filling the groove. As a result, the SiN film 106 in the grooves have their upper surfaces located at substantially the same level as the upper surface of the n+ polysilicon film 103.

Next, as illustrated in FIG. 6 and FIG. 7A, a photoresist (not shown) is coated on the entire surface of the resultant structure. The photoresist is subjected to photolithography, providing a photoresist pattern which lies above the substrate regions to become gate electrodes and connecting sections (i.e., wiring regions) for connecting gate electrodes. Using the photoresist pattern as a mask, RIE method is performed, removing those parts of the n+ polysilicon film 103 and SiN film 106, which are not covered by the photoresist pattern. The n+ polysilicon film 103 is thereby patterned in conformity with gate electrodes that will be formed later. The photoresist pattern is then removed. Using the n+ polysilicon film 103, thus patterned, as a mask, ion implantation is effected, forming source diffusion layers 111a and drain diffusion layers 111b. Further, the resultant structure is annealed, if necessary.

As shown in FIG. 7B, an insulator film 107 (third insulator film) having a thickness of 20 nm or more is deposited by CVD method on the entire surface of the resultant structure. Those parts of the film 107, which are formed on the n+ polysilicon film 103 and SiN film 106, are removed by means of CMP method. As a result, the insulator film 107 is then formed at the portions from which the n+ polysilicon film 103 and SiN film 106 are removed in the previous step (FIGS. 6 and 7A). The insulator film 107 is made of silicon oxide in most cases. Instead, the film 107 can be made of SiN, alumina, $TiO_2$, organic glass, or the like.

Next, as shown in FIG. 7C, a photoresist is coated on the entire surface of the resultant structure. The photoresist is removed by means of photolithography, except the part shown in the right part of FIG. 7C, in which an NMOS transistor will be formed. A photoresist pattern is thereby formed. Using the photoresist pattern as a mask, the polysilicon film 13 (only the left part of FIG. 7C) is removed by etching, under which a PMOS transistor will be formed. The photo-resist pattern is removed. Then, that part of the thermal oxide film 102, which is formed on the PMOS transistor region, is removed by means of wet etching. A gate insulator film 108 (fourth insulator film) for the PMOS transistor is formed. A p+ polysilicon film 109 (first gate conductive film) is deposited on the gate insulator film 108 by means of CVD method. The gate insulator film 108, which will become the gate electrode of the PMOS transistor, may be a deposited film, either silicon oxide film or silicon nitride film. Alternatively, the film 108 can be a thermal oxide film formed by thermally oxidizing the surface of the silicon substrate 101.

Figure 7D:
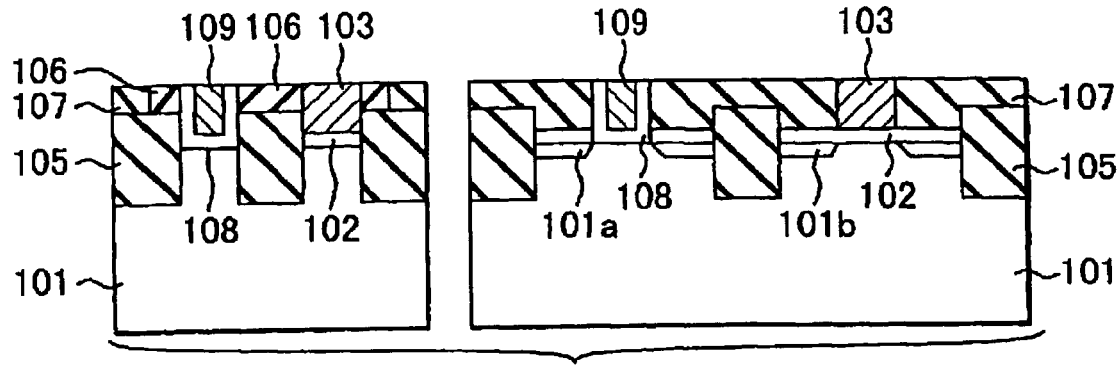

As shown in FIG. 7D, the p+ polysilicon film 109 is removed by CMP method, except the parts filled in the grooves. The gate insulator film 108, thus processed and functions as the gate insulator film of the PMOS transistor, does not contact a photoresist at all.

Figure 7E:
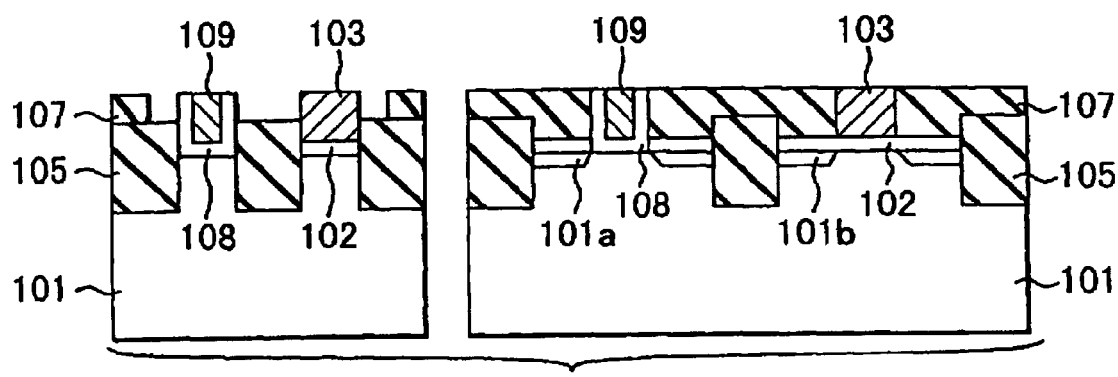

As shown in FIG. 7E, the SiN film 106 is subjected to selective etching using heated phosphoric acid solution, whereby the parts provided on the trench isolation are removed. Further, upper portions of the oxide films 108 which is formed over the insulator film 105 are removed by wet etching.

Figure 7F:
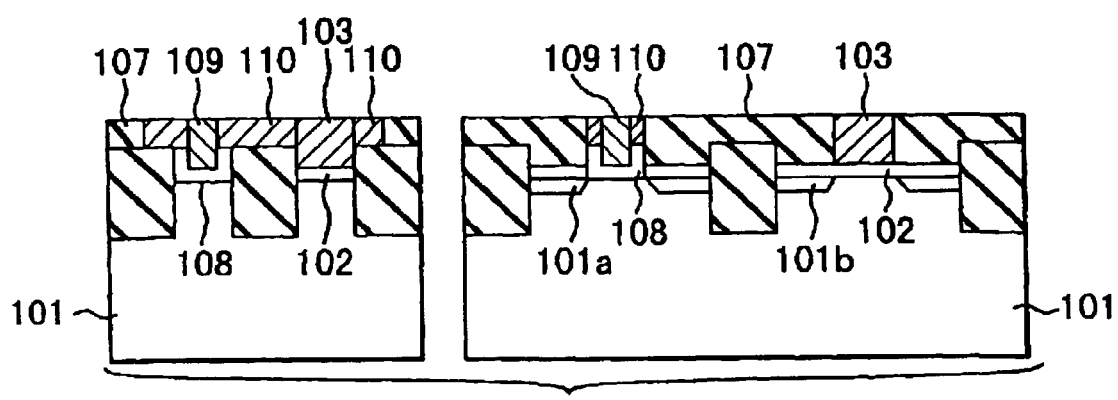

Next, as shown in FIG. 7F, a metal film such as W film 110 (connecting conductor film) is deposited by CVD method on the entire surface of the resultant structure. The W film 110 is removed by CMP method, except the parts filling the grooves. The W film 110 remaining in the groove electrically connects the n+ polysilicon films 103 (i.e., the gate electrode of the NMOS transistor) and the p+ polysilicon film 109 (i.e., the gate electrode of the PMOS transistor). Since the W film 110 is buried in self-alignment in the groove made between the n+ polysilicon films 103 and the p+ polysilicon film 109, reducing the area of the connecting section (i.e., wiring region) of the semiconductor device.

Thereafter, an insulator film is deposited on the entire surface of the substrate 101. Wires are then formed in the known method, thereby manufacturing an LSI device.

Other embodiments of the semiconductor device according to the present invention will be described.

The same portions as those of the first embodiment will be indicated in the same reference numerals and their detailed description will be omitted.

Second Embodiment

A method of manufacturing a semiconductor device, according to the second embodiment of the present invention will be described, with reference to FIGS. 8A to 8D. The components similar or identical to those of the device made by the first embodiment are designated at the same reference numerals in FIGS. 8A to 8C, and will not be described in detail.

The initial several steps of the method according to the second embodiment are identical to those of the first embodiment, the last of which is illustrates in FIG. 7D. This structure made by performing these several steps is illustrated also in FIG. 8A.

Figure 8A:
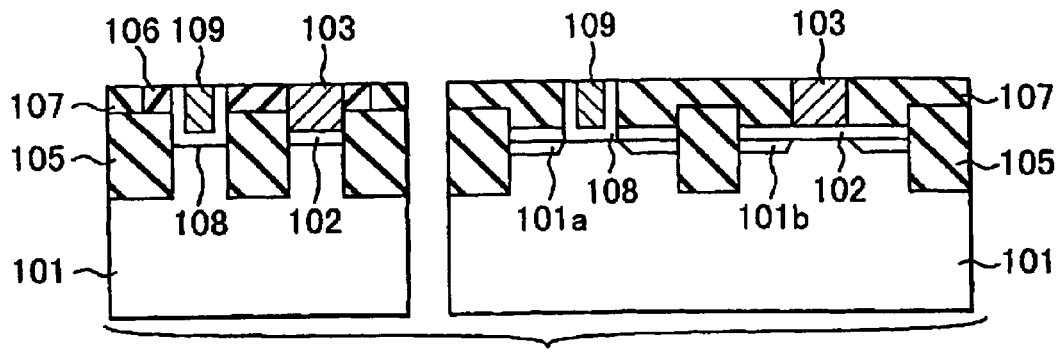
FIGS. 8A to 8D are sectional views explaining some of the steps of a method of manufacturing a semiconductor device, according to a second embodiment of the present invention.
Figure 8B:
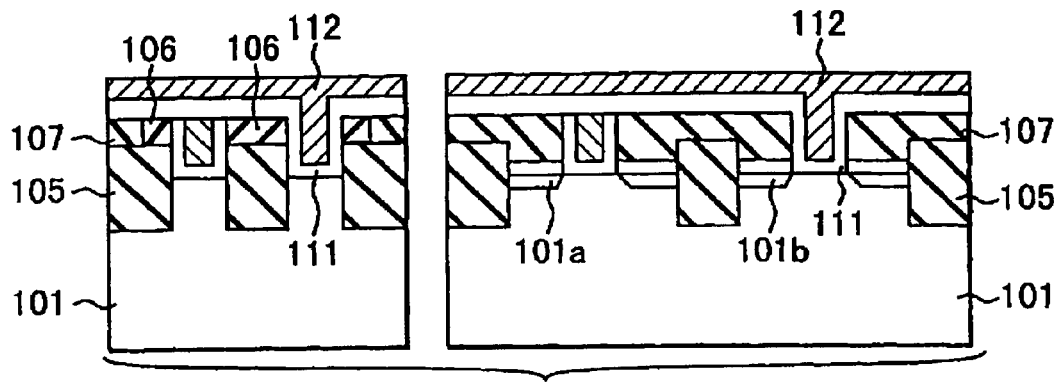

As shown in FIG. 8B, a photoresist is coated on the entire surface of the resultant structure. The photoresist is removed by means of photolithography, except the left section of the structure, in which a PMOS transistor will be formed. A photoresist pattern is thereby formed. Using the photoresist pattern as a mask, only the polysilicon film 103 right section of FIG. 8B) is removed by etching, under which a PMOS transistor will be formed. The photoresist pattern is removed. Then, that part of the thermal oxide film 102, which is formed on the NMOS transistor region, is removed by means of wet etching. The gate insulator film 111 of the NMOS transistor (fifth insulator film) is formed. Further, an n+ polysilicon film 112 (second gate conductive film) is deposited by CVD method on the gate insulator film 111. The film 112 will become the gate electrode of the NMOS transistor. The gate insulator film 111 may be a silicon nitride film formed by deposition or a thermal oxide film formed by thermally oxidizing the surface of the silicon substrate 101.

Figure 8C:
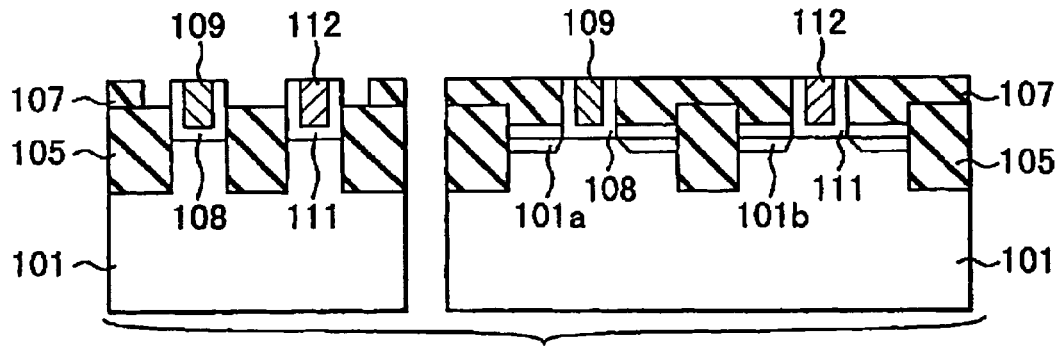

Next, as shown in FIG. 8C, the n+ polysilicon film 112 is removed by CMP method, except the parts filling the grooves. The gate insulator film 111 of the NMOS transistor, thus formed, does not contact a photoresist at all. Then, the SiN film 106 is subjected to selective etching using heated phosphoric acid solution, whereby the parts provided on the trench isolations are removed. Further, upper portions of the oxide films 108 which is formed over the insulator film 105 are removed by wet etching.

Figure 8D:
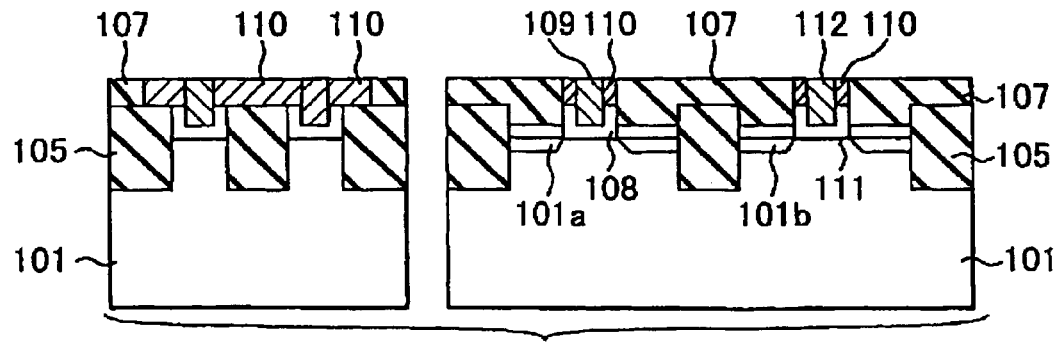

As shown in FIG. 8D, a metal film such as the W film 110 (connecting conductor film) is deposited by CVD method on the entire surface of the resultant structure. The W film 110 is removed by CMP method, except the parts filling the groove. The W film 110 remaining in the groove electrically connects the n+ polysilicon films 112 (i.e., the gate electrode of the NMOS transistor) and the p+ polysilicon film 109 (i.e., the gate electrode of the PMOS transistor). Since the W film 110 is buried in self-alignment in the groove made between the n+ polysilicon films 112 and the p+ polysilicon film 109, reducing the area of the connecting section (i.e., wiring region) of the semiconductor device.

Thereafter, an insulator film is deposited on the entire surface of the resultant structure. Wires are then formed in the known method, thereby manufacturing an LSI.

In the second embodiment, not only the gate insulator film and gate electrode of the PMOS transistor, but also those of the NMOS transistor have damascene structure. Hence, plasma damage can be minimized and no heat treatment needs to be performed, after the forming of the gate insulator film of the NMOS transistor. The initial failure of the gate insulator film can therefore be reduced, thereby enhancing the reliability of the semiconductor device. Details of damascene structure is described in the copending U.S. patent application Ser. No. 08/996,704, filed on Dec. 23, 1997. Briefly speaking, damascene gate is formed by first forming a dummy insulator film and a dummy electrode on that part of the substrate in which a gate electrode will be formed. The dummy insulator film and the dummy electrode are removed and then a gate insulator film and a gate electrode are formed on that part of the substrate from which the dummy insulator film and the dummy electrode have been removed.

Third Embodiment

Figure 9A:
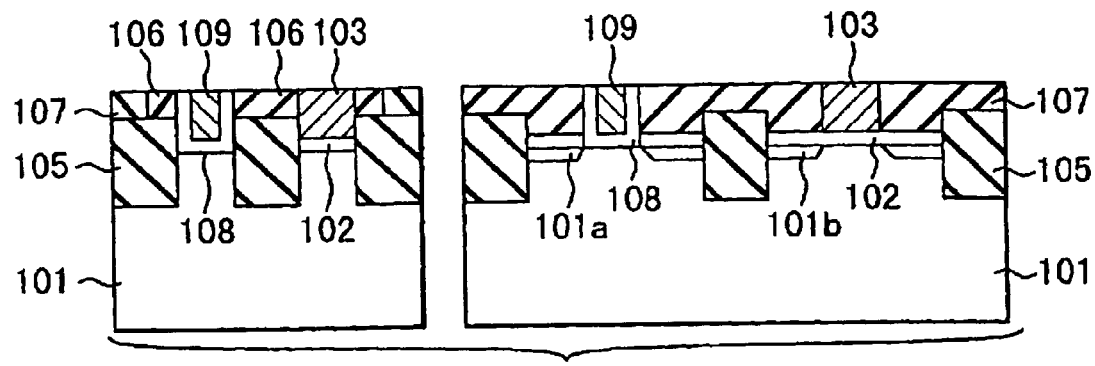
FIGS. 9A to 9C are sectional views explaining some of the steps of a method of manufacturing a semiconductor device, according to a third embodiment of the present invention.

A method of manufacturing a semiconductor device, according to the third embodiment of the present invention, will be described, with reference to FIGS. 9A to 9C. The components similar or identical to those of the device made by the first embodiment are designated at the same reference numerals in FIGS. 9A to 9C, and will not be described in detail.

The initial several steps of the method according to the third embodiment are identical to those of the first embodiment, the last of which is illustrates in FIG. 7D. This structure made by performing the initial several steps is illustrated also in FIG. 9A.

Figure 9B:
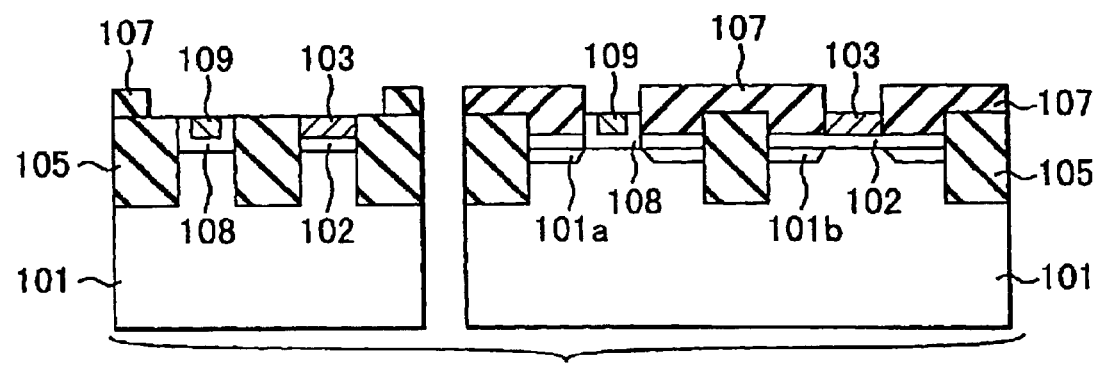

As shown in FIG. 9B, the polysilicon films 103 and 109 are etched at their tops by 0.1 micron, by means of RIE method. Those parts of the SiN film 106, which are formed on the element-isolation regions, are removed by means of selecting etching using heated phosphoric acid solution. The upper portions of the oxide films 108 which is formed over the insulator film 105 are removed by wet etching.

Figure 9C:
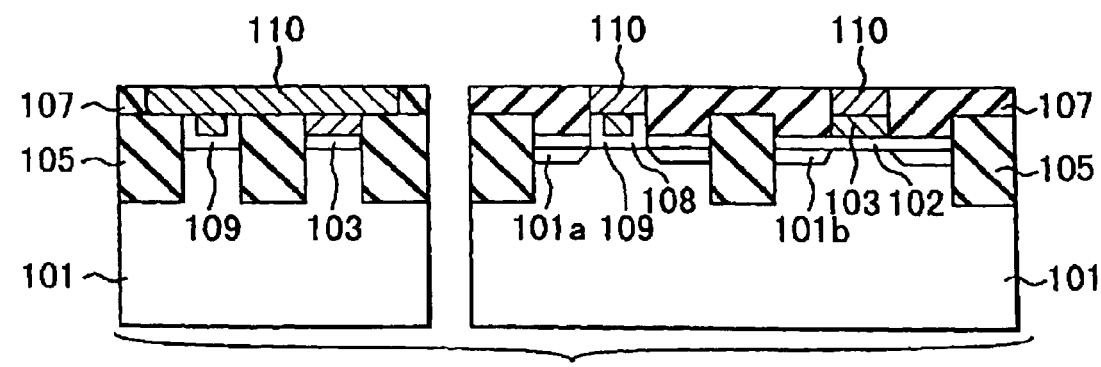

As shown in FIG. 9C, W film 110 (connecting conductor film) is deposited by CVD method on the entire surface of the resultant structure. The W film 110 is removed by CMP method, except the parts filling the grooves. The W film 110 remaining in the groove electrically connects the n+ polysilicon film 103 (i.e., the gate electrode of the NMOS transistor) and the p+ polysilicon film 109 (i.e., the gate electrode of the PMOS transistor). Since the W film 110 is buried in self-alignment in the grooves, reducing the area of the connecting section (i.e., wiring region) of the semiconductor device. Further, the W film 110 serves to decrease the resistance of the gate electrodes of the NMOS and PMOS transistors, because it is formed on both the n+ polysilicon film 103 and the p+ polysilicon film 109.

Thereafter, an insulator film is deposited on the entire surface of the resultant structure. Wires are then formed in the known method, thereby manufacturing an LSI.

In the third embodiment describe above, the gate of the MOS transistor of only one type has damascene structure. Nevertheless, like the second embodiment, the third embodiment can be used to manufacture a device in which both the gates of the NMOS transistor and the gate of the PMOS transistor have damascene structure.

In the first to third embodiments, an SiN film, for example, may be formed on the n+ polysilicon film 103, thus providing a multi-layer structure. This SiN film, n+ polysilicon film 103 and silicon substrate 101 may then be etched in the same way as shown in FIG. 5A, thereby forming grooves which will serve as trench isolations. Because of the multi-layer structure, it is possible to provide a large margin for compensating process variation in, for example, CMP method.

As described above, according to the first to third embodiments, no photoresist contacts the gate insulator films because the gate of any transistor formed has damascene structure. Therefore, the first to third embodiments can manufacture high-reliability semiconductor devices. Furthermore, the wiring region connecting the gate electrodes formed in different steps occupies but a small area since it has been formed in self-alignment with the gate electrodes.

Fourth Embodiment

A method of manufacturing a semiconductor device, according to the fourth embodiment of the present invention, will be described, with reference to FIG. 10, FIGS. 11A to 11H, FIGS. 12A to 12H, 13A to 13D, and FIG. 14.

Figure 10:
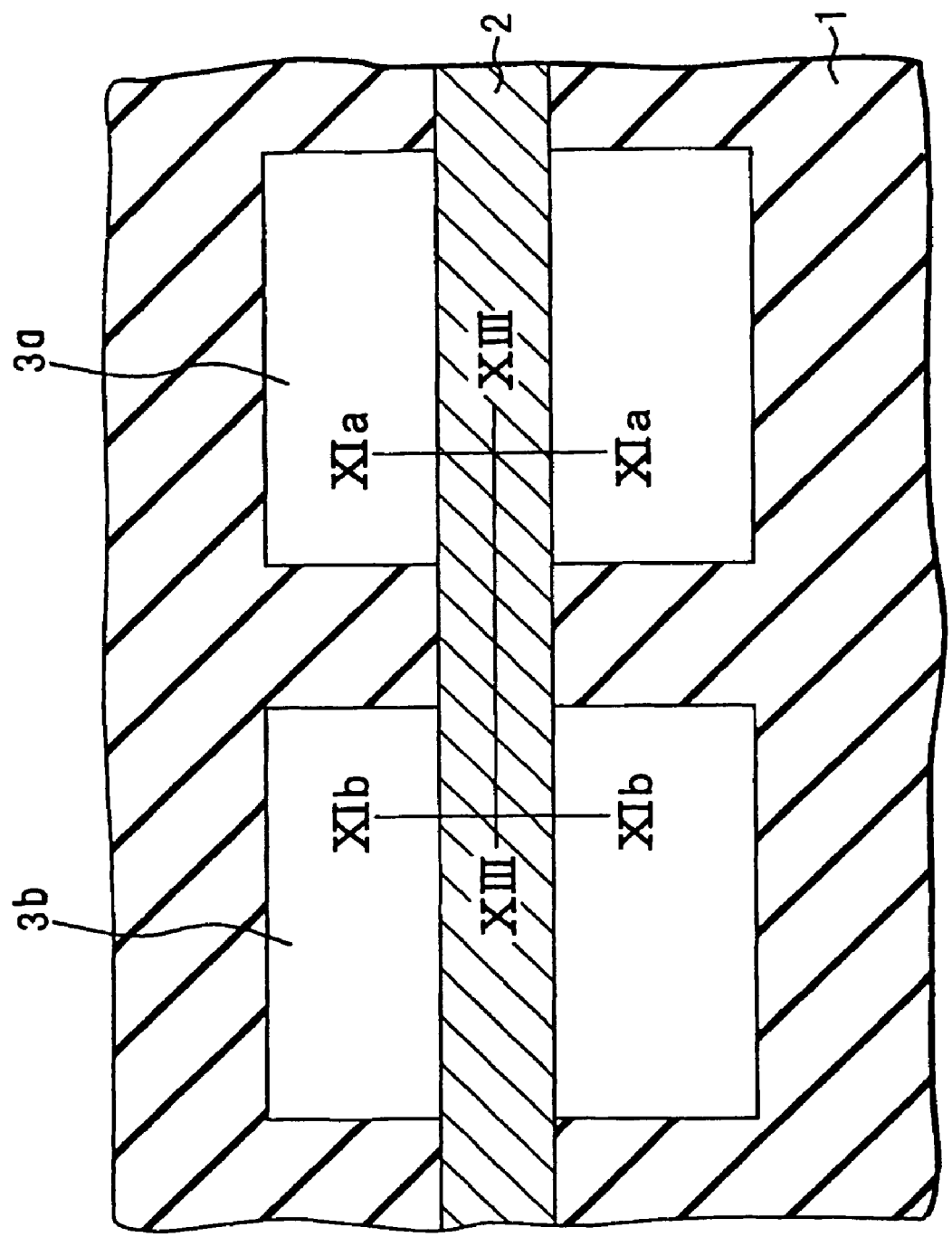
FIG. 10 is a plan view of a semiconductor device comprising gate electrodes made of different materials and/or being different in thickness and gate insulator films-made of different materials and/or being different in thickness, for explaining five methods of manufacturing the semiconductor device according to fourth to eighth embodiments of the present invention.

FIG. 10 is a plan view of a semiconductor device comprising gate electrodes made of different materials and/or being different in thickness and gate insulator films made of different materials and/or being different in thickness, according to fourth to eighth embodiments of the present invention.

FIGS. 11A to 11H are sectional views, explaining the steps of the method according to the fourth embodiment, each view consisting of a right section taken along line XIa-XIa shown in FIG. 10 and a left section taken along line XIb-XIb shown in FIG. 10.

Figure 14:
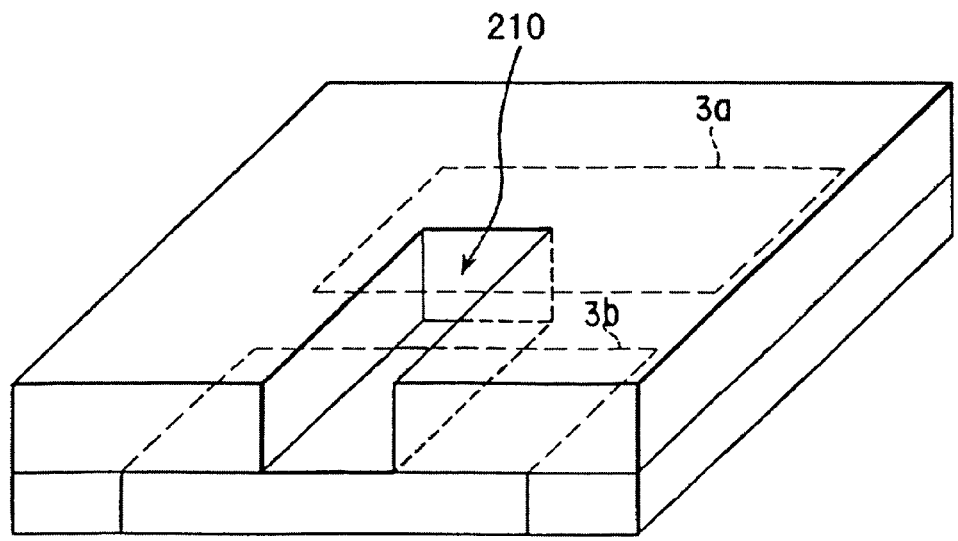
FIG. 14 is a perspective view of the semiconductor device being manufactured in the step illustrated in FIGS. 11C and 12C.

FIGS. 12A to 12H are plan views of the semiconductor device being manufactured in the steps illustrated in FIGS. 11A to 11H, respectively. FIGS. 13A to 13D are sectional views taken along line XIII-XIII shown in FIG. 10, explaining the method according to the fourth embodiment of the present invention. FIG. 14 is a perspective view of the semiconductor device being manufactured in the step illustrated in FIGS. 11C and 12C.

FIG. 10 is a schematic plan view of a semi-conductor device which can be manufactured by the method according to the fourth embodiment of the present invention. As shown in FIG. 10, the device comprises an trench isolation 1, a gate wiring region 2, and diffusion regions 3a and 3b.

Figure 11A:
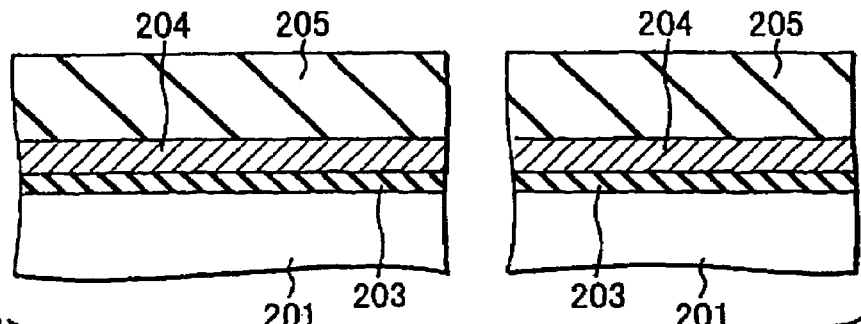
FIGS. 11A to 11H are sectional views, explaining the steps of the method according to the fourth embodiment of the present invention, each view consisting of a right section taken along line XIa-XIa shown in FIG. 10 and a left section taken along line XIb-XIb shown in FIG. 10.
Figure 12A:
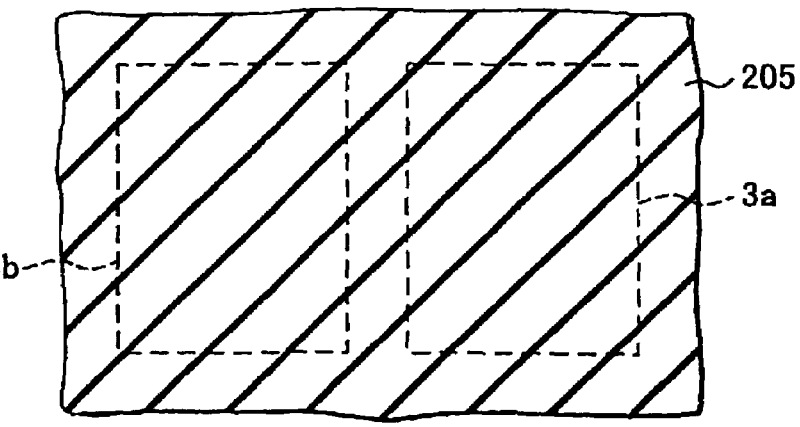
FIGS. 12A to 12H are plan views of the semiconductor device being manufactured in the steps illustrated in FIGS. 11A to 11H, respectively.

At first, a well region (not shown) and an trench isolation 202 (shown in FIG. 13A) of STI (Shallow Trench Isolation) structure are formed in a silicon substrate 201. Thereafter, as shown in FIGS. 11A and 12A, a first gate oxide film 203 is formed on the substrate 201 by means of thermal oxidation. A polysilicon film 204 is formed on the first gate oxide film 203 by CVD method, and a silicon nitride film 205 is formed on the film 204 by CVD method. A multi-layer film consisting of the films 204 and 205 is thereby obtained. Dopant impurities are added to the polysilicon film 204 while the film 204 is being formed, or ion-implanted into the film 204 after the film 204 has been formed.

Figure 11B:
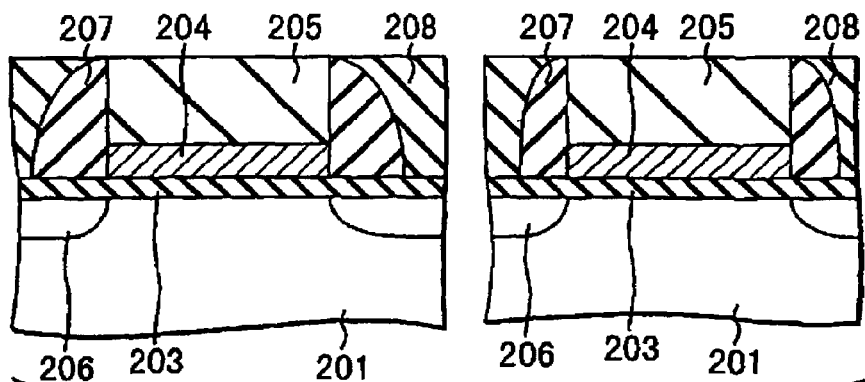
Figure 12B:
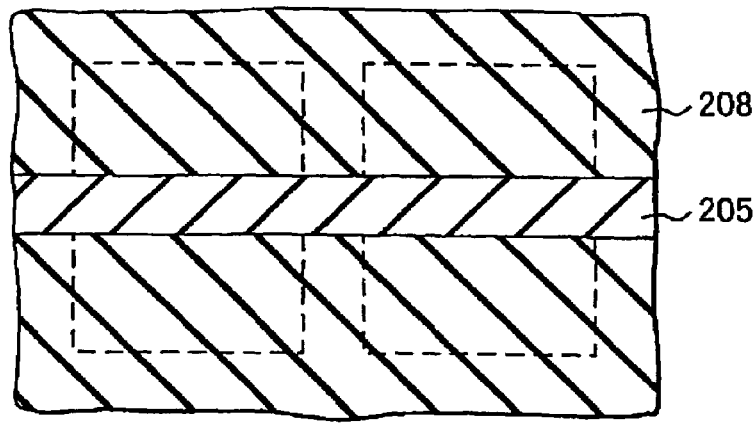

Next, the multi-layer film composed of the polysilicon film 204 and silicon nitride film 205 is patterned by means of lithography and dry etching, forming a gate-wiring pattern. Using the gate-wiring pattern as a mask, impurities are ion-implanted, thereby forming an LDD (Lightly Doped Drain) layer. Silicon oxide films 207 are then formed on the sides of the gate-wiring pattern. A dummy gate-wiring structure is formed, composed of a dummy gate wire and the insulator films 207. Using the dummy gate-wiring structure as a mask, impurities are ion-implanted. The resultant structure is subjected to heat treatment, whereby a source diffusion region 206 and a drain diffusion region 206 are formed. A silicon oxide film 208 is then formed by CVD method on the entire upper surface of the resultant structure. The film 208 covers the dummy-gate structure entirely. Thereafter, chemical mechanical polishing is performed on the silicon oxide film 208, using the silicon nitride film 205 as a stopper. The resultant structure therefore has a flat upper surface as is illustrated in FIGS. 11B and 12B.

Figure 11C:
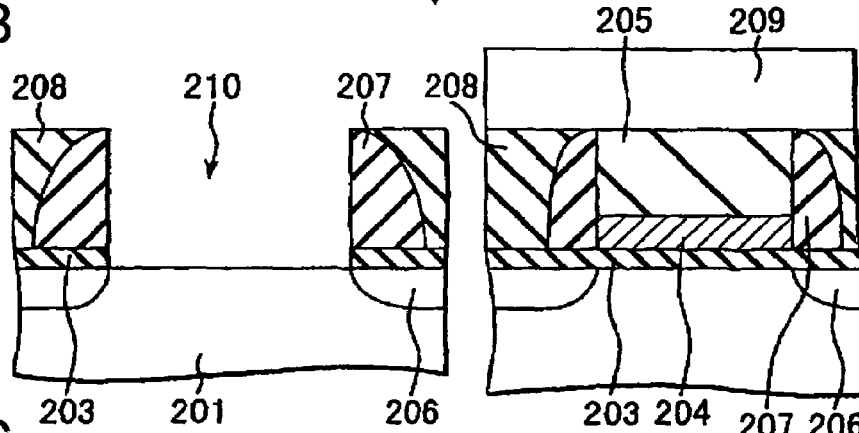
Figure 12C:
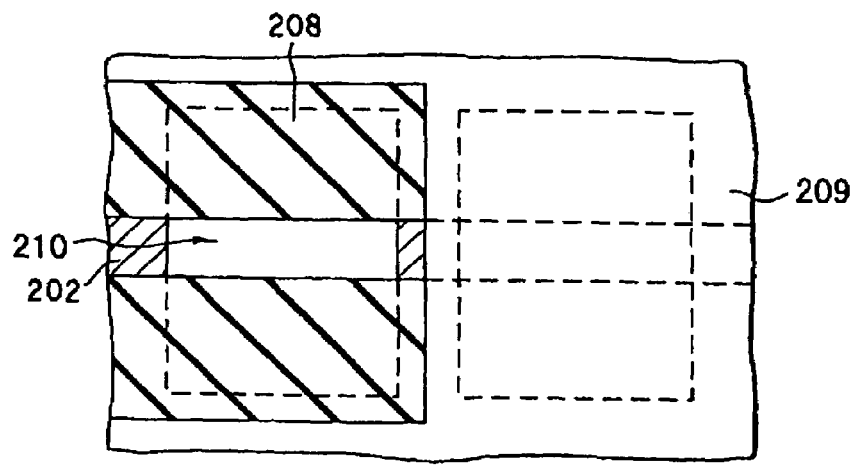
Figure 13A:
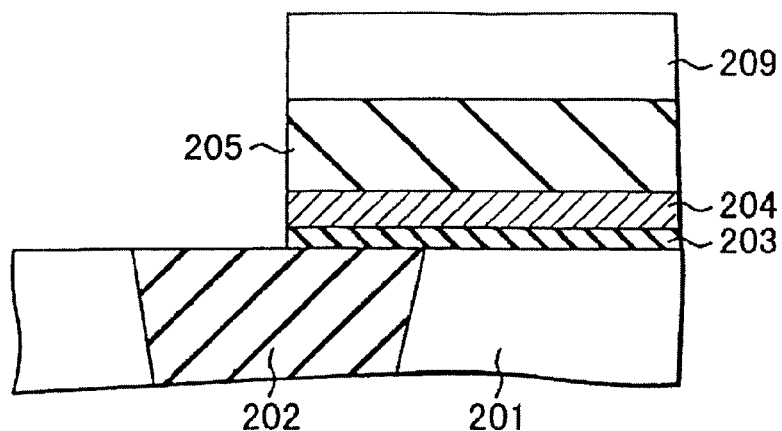
FIGS. 13A to 13D are sectional views taken along line XIII-XIII shown in FIG. 10, explaining the method according to the fourth embodiment of the present invention.

Next, a photoresist 209 is coated on the region (the diffusion region 3a shown in FIG. 10) in which a first transistor will be formed. Heated phosphoric acid solution and hydrazine solution, for example, are sequentially applied, removing the SiN$_4$ film 205 and the polysilicon film 204 in the order mentioned. A groove 210 is thereby made. Impurities are ion-implanted into the channel region through that part of the gate oxide film 203 which is exposed at the bottom of the groove 210. Thereafter, hydrofluoric acid solution is applied, removing the exposed part of the oxide film 203, as is illustrated in FIGS. 11C, 12C and 13A.

FIG. 14 shows the structure with the dummy gate removed from the region (i.e., the diffusion region 3b shown in FIG. 10) in which a second transistor will be formed.

Figure 11D:
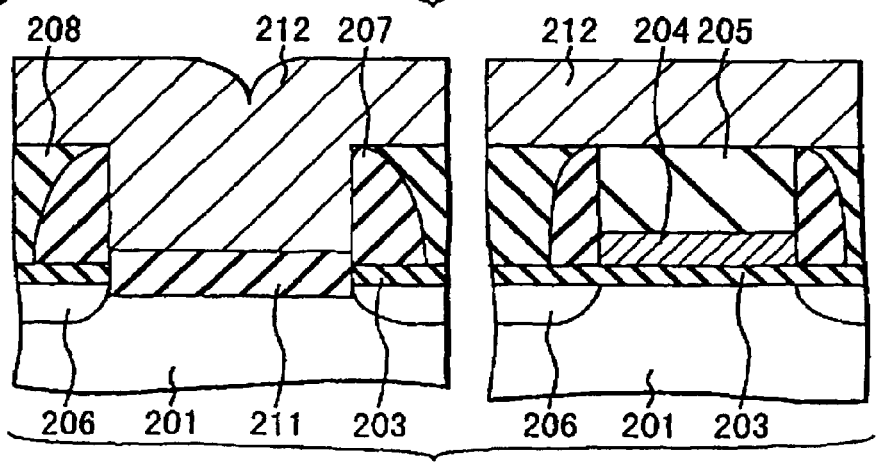
Figure 12D:
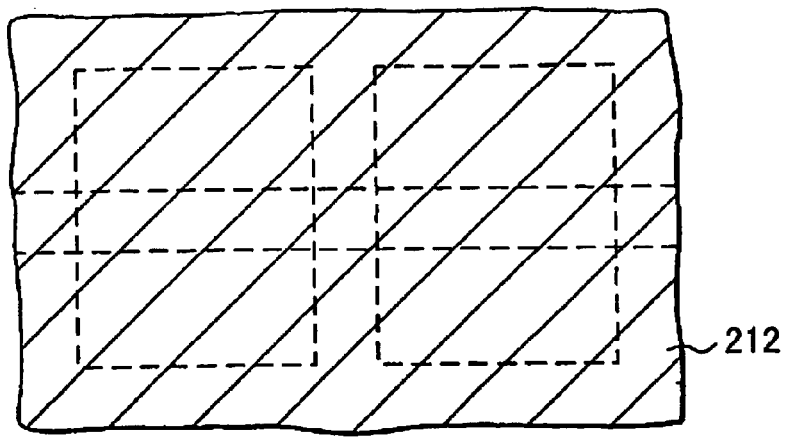
Figure 13B:
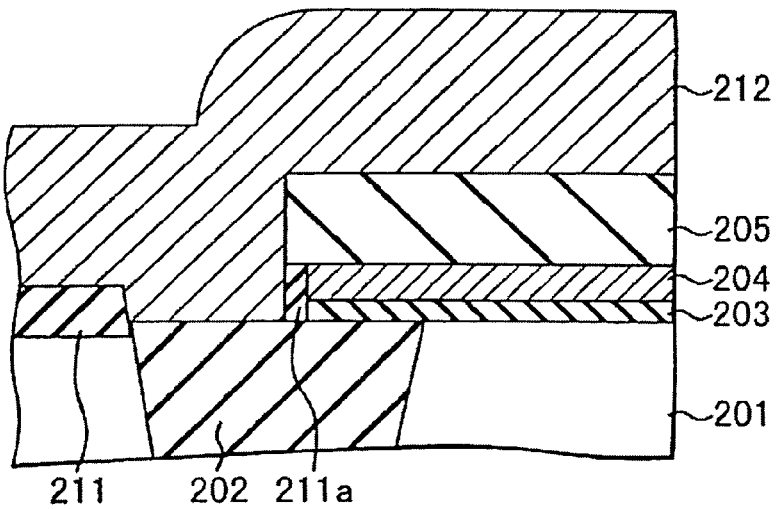

As shown in FIGS. 11D, 12D and 13B, a gate insulator film 211 is formed on the exposed part of the silicon substrate 201 by means of thermal oxidation. Further, a tungsten film 212 is formed on the entire upper surface of the resultant structure.

Figure 11E:
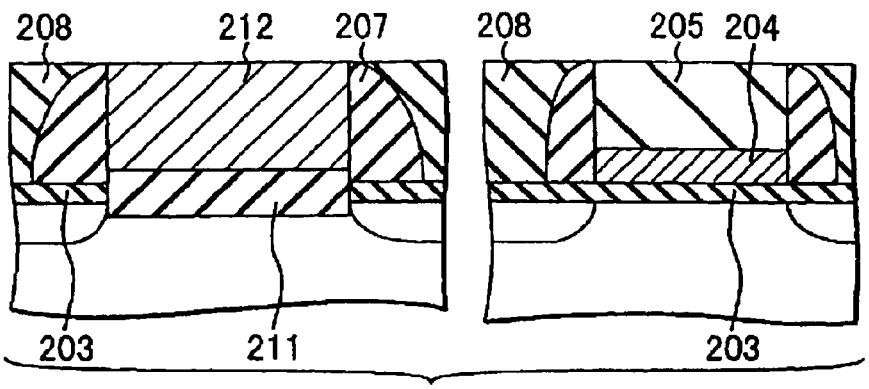
Figure 12E:
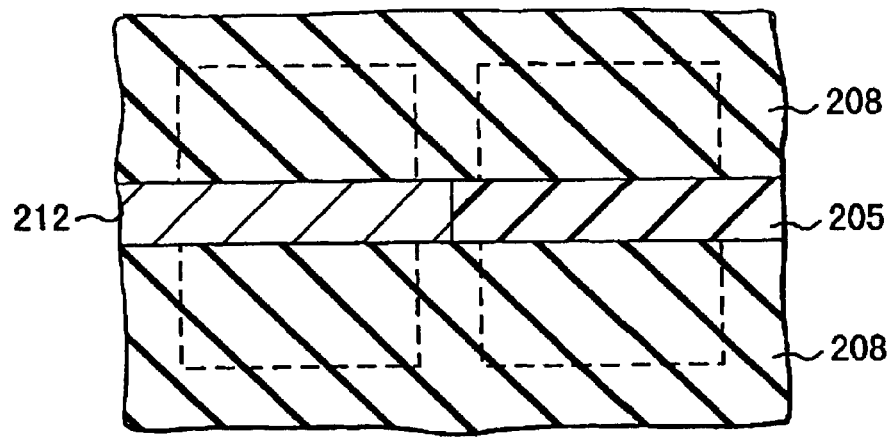

Next, the tungsten film 212 is removed by CMP method, except the part filling the groove, as is illustrated in FIGS. 11E and 12E.

Figure 11F:
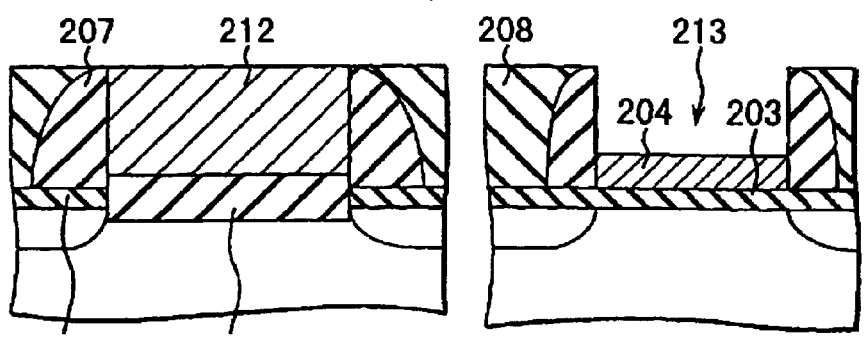
Figure 12F:
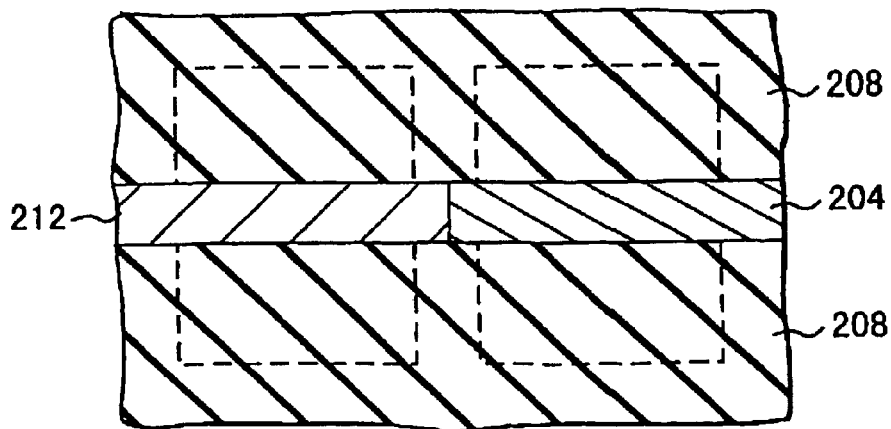

As shown in FIGS. 11F and 12F, heated phosphoric acid solution is applied, removing the SiN film 205 from the polysilicon film 204. A groove 213 is thereby formed, exposing the polysilicon film 204.

Figure 11G:
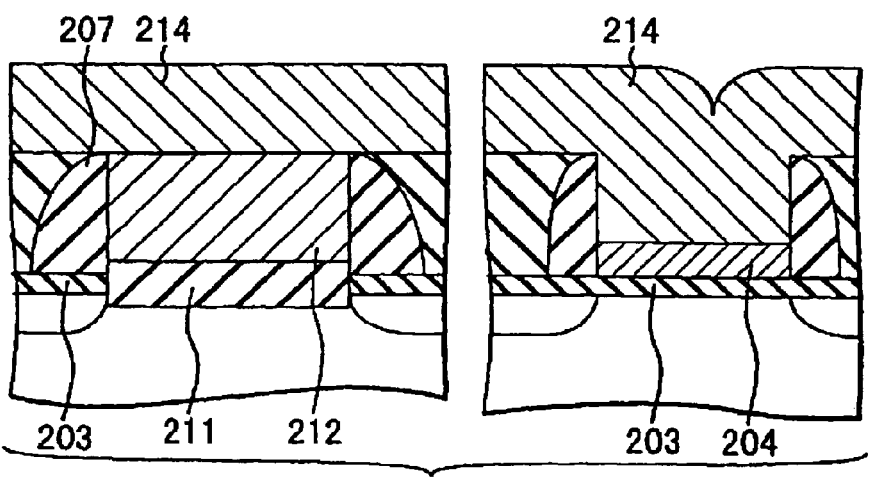
Figure 12G:
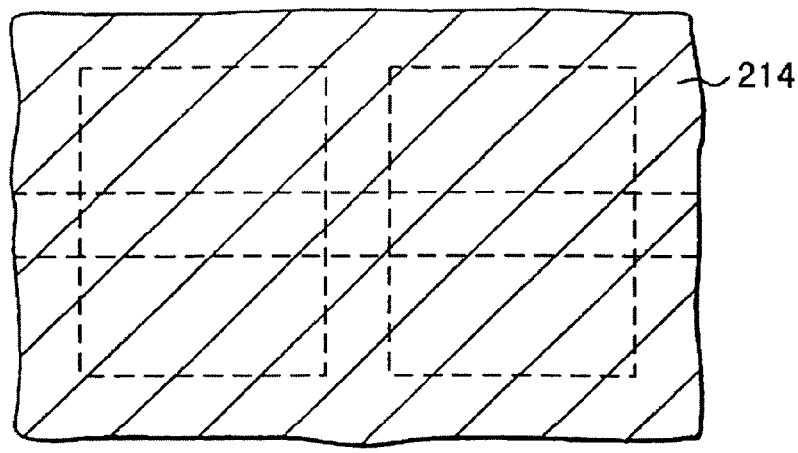
Figure 13C:
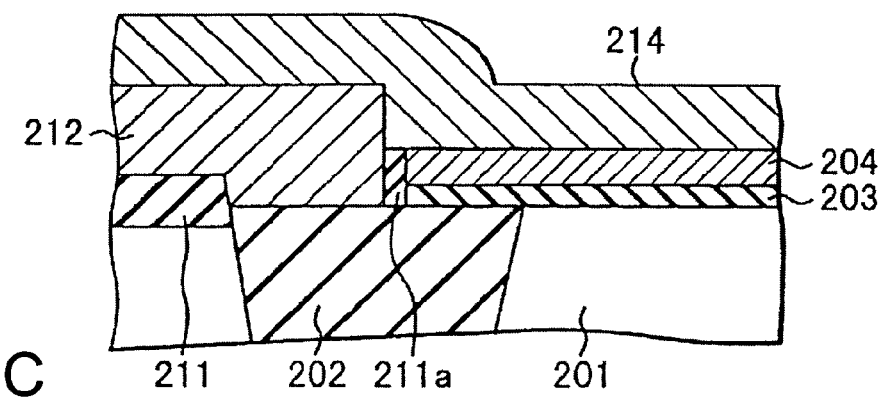

As shown in FIGS. 11G, 12G and 13C, a tungsten film 214 is deposited on the entire upper surface of the resultant structure. The tungsten film 214 electrically connects the polysilicon film 204 to the tungsten film 212. Without the tungsten film 214, the sides of the polysilicon film 204 are oxidized, forming silicon oxide films 211a. These silicon oxide films 211a would inevitably insulate the polysilicon film 204 from the tungsten film 212.

Figure 11H:
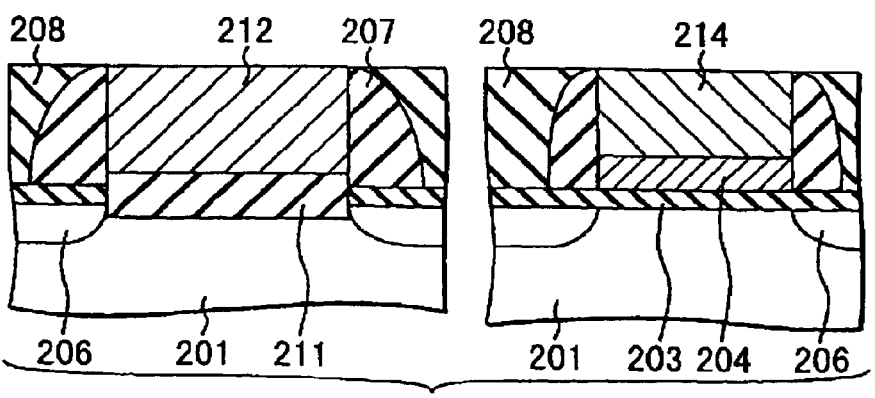
Figure 12H:
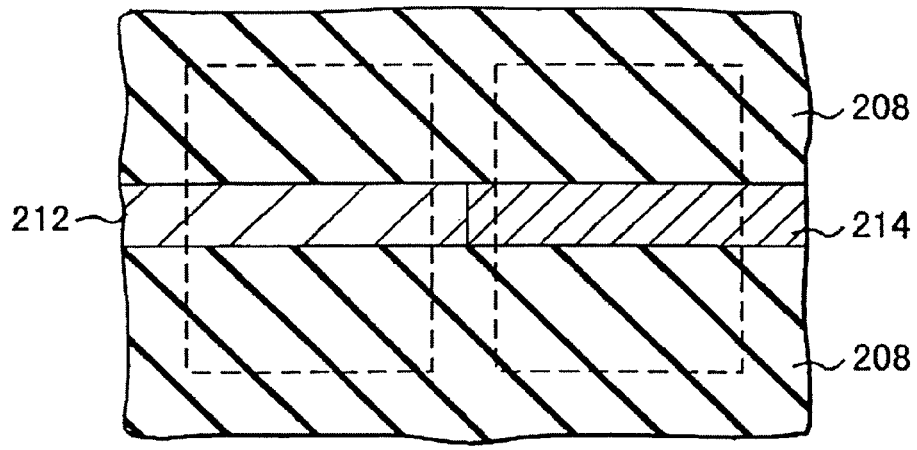
Figure 13D:
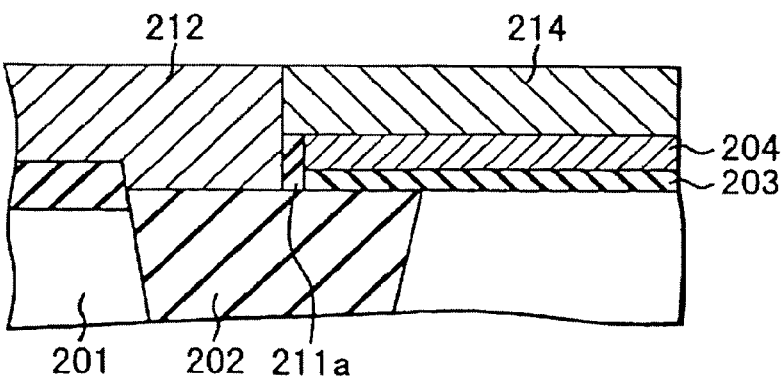

Then, CMP method is performed on the tungsten film 214, leaving only that part of the film 214 which fills the groove, as is illustrated in FIGS. 11H, 12H and 13D.

The major manufacturing steps are thus completed, forming the first and second transistors, which differ in the thickness' of the gate oxide film, by a relatively simple method. Thereafter, ordinary wiring steps are carried out, forming wires. As a result, a semiconductor integrated circuit is manufactured by the fourth embodiment.

In the forth embodiment, the gate insulator film 203 first formed does not contact any photoresist at all. Further, no step is performed between the step of forming the gate insulator film 203 and the step of forming the polysilicon film 204 thereon. That is, the films 203 and 204 are continuously formed in the order mentioned. Still further, lithography and dry etching of gate-electrode level, which involve the most strict requirements for forming elements of extremely small dimensions, need be carried out only once in the fourth embodiment. Therefore, the device can be easily manufactured.

Figure 3A:
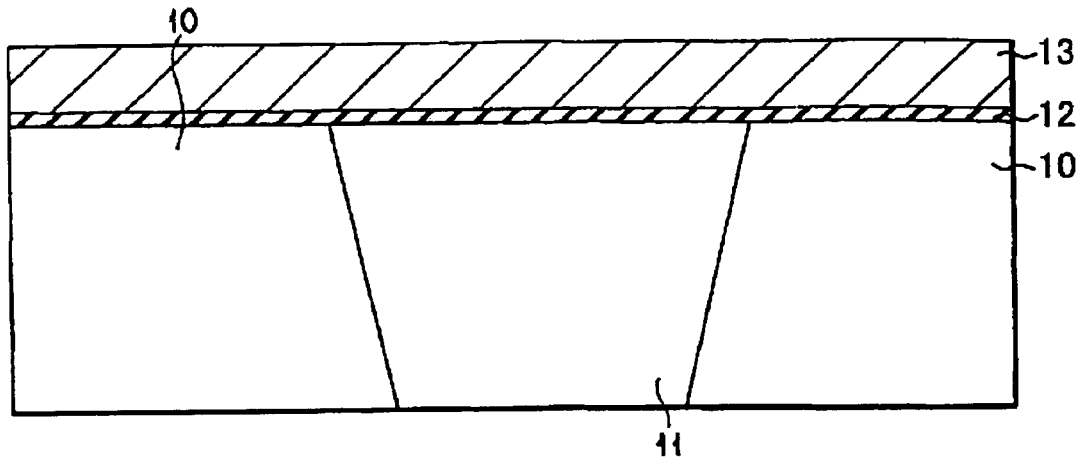
FIGS. 3A to 3E are sectional views, explaining a conventional method of manufacturing the semiconductor device shown in FIG. 1, each view taken along line III-III shown in FIG. 1.
Figure 3B:
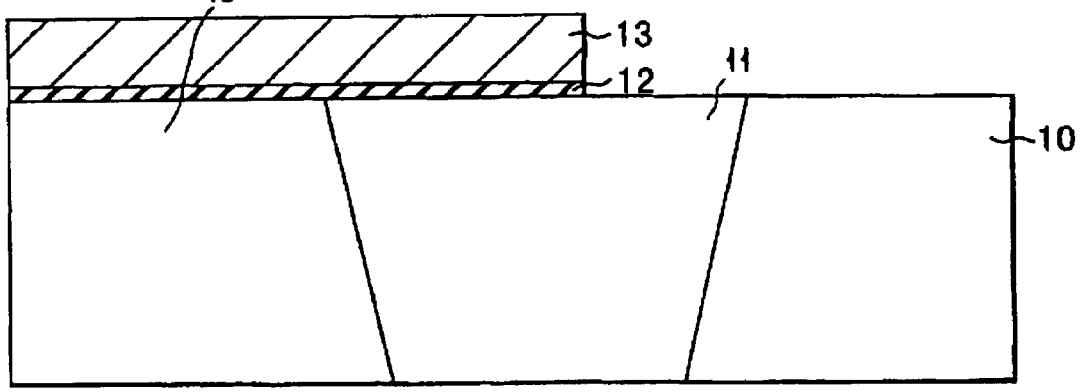
Figure 3C:
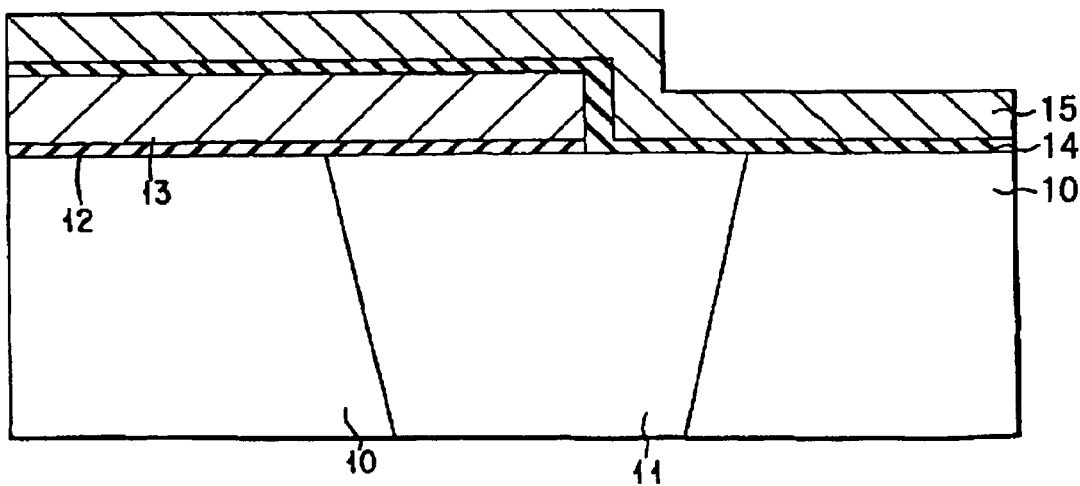
Figure 3D:
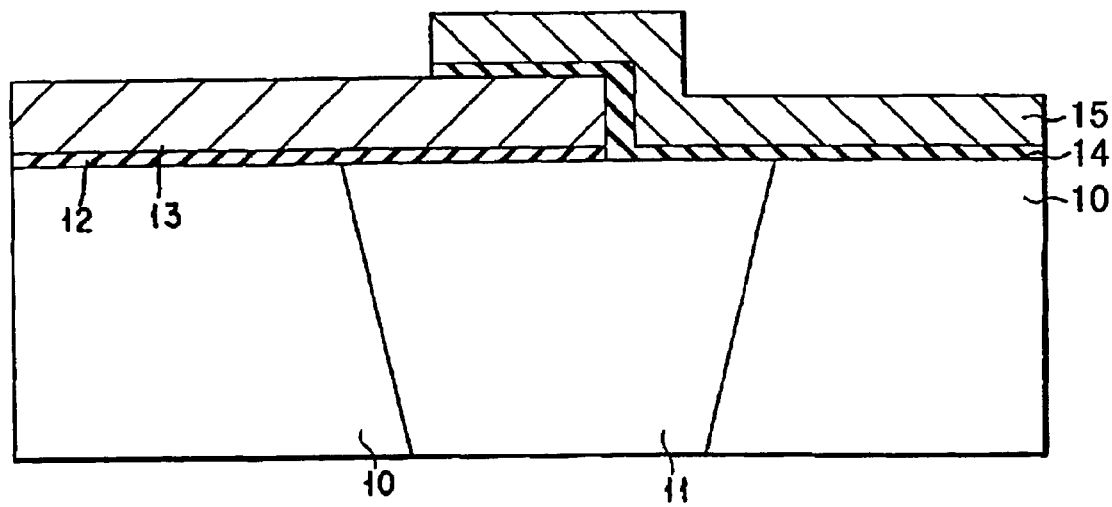
Figure 3E:
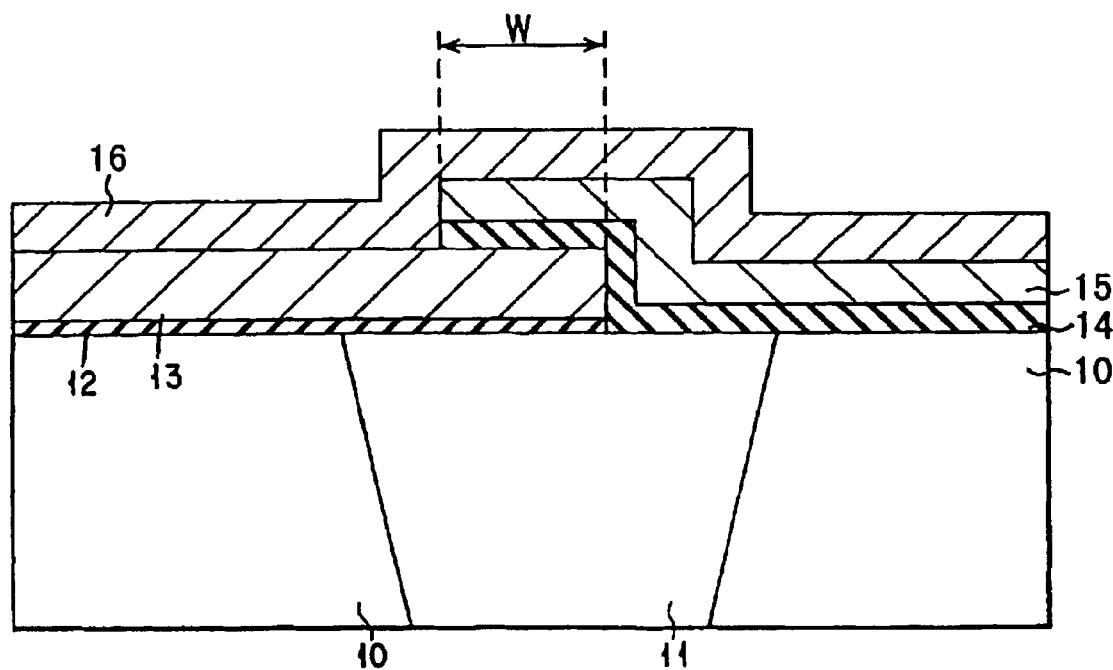

The method according to the fourth embodiment will be found to be advantageous when the semiconductor device made by the method is compared with one manufactured by the conventional method. FIG. 3E shows the junction between two transistors incorporated in the device made by the conventional method. FIG. 13D illustrates the junction between two transistors incorporated in the device made by the fourth embodiment of the present invention.

As comparison between FIG. 3E and FIG. 13D reveals, the device made by the fourth embodiment does not have the first problem inherent to the device made by the conventional method. That is, there is no need to form an overlap portion (distance W) between the first and second gate electrodes at the junction. Hence, the trench isolation can be narrower by that distance W than its counterpart of the device made by the conventional method. The fourth embodiment of the present invention therefore serves to increase the number of chips that can be cut from a silicon wafer. This helps lower the manufacturing cost of the semiconductor device.

Nor does the device made by the fourth embodiment have the second problem inherent to the device made by the conventional method. That is, the device has no protruded portions. Therefore, very complicated lithography or dry etching need not be carried out to form wires. It is not difficult for the fourth embodiment to manufacture a semiconductor device incorporating elements of extremely small dimensions.

Fifth Embodiment

A method of manufacturing a semiconductor device, according to the fifth embodiment of the present invention, will be descried with reference to FIGS. 15A to 15I and FIGS. 16A to 16E.

The semiconductor device manufactured by the method according to the fifth embodiment looks just the same as the device made by the fourth embodiment when viewed from the above, as is illustrated in FIG. 10. The components similar or identical to those of the device made by the fourth embodiment are designated at the same reference numerals in FIGS. 15A to 15I and FIGS. 16A to 16E, and will not be described in detail.

FIGS. 15A to 15I are sectional views explaining the steps of the method according to the fifth embodiment of the present invention. Each of these figures consists of a right section taken along line XIa-XIa shown in FIG. 10 and a left section taken along line XIb-XIb shown in FIG. 10. FIGS. 16A to 26E are sectional views explaining the steps of the method according to the fifth embodiment, each view taken along line XIII-XIII shown in FIG. 10.

The steps of the fifth embodiment, shown in FIGS. 15A to 15C and FIG. 16A, are basically identical to the steps of the fourth embodiment, which are not therefore be described. The steps following these will be described below.

Figure 15A:
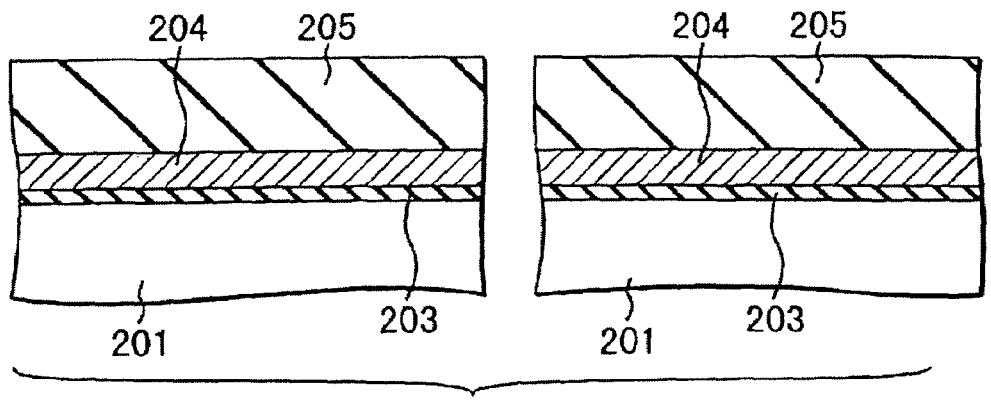
FIGS. 15A to 15I are sectional views explaining the steps of the method according to the fifth embodiment of the present invention, each view consisting of a right section taken along line XIa-XIa shown in FIG. 10 and a left section taken along line XIb-XIb shown in FIG. 10.
Figure 15B:
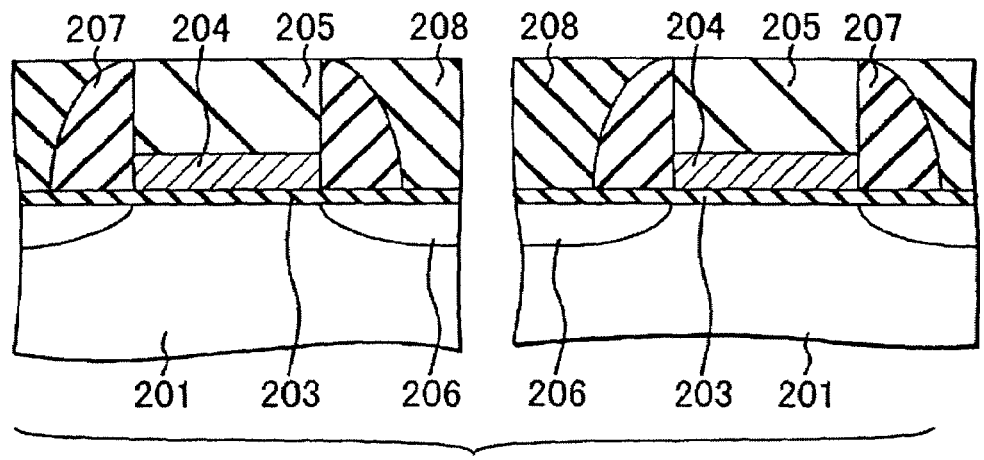
Figure 15C:
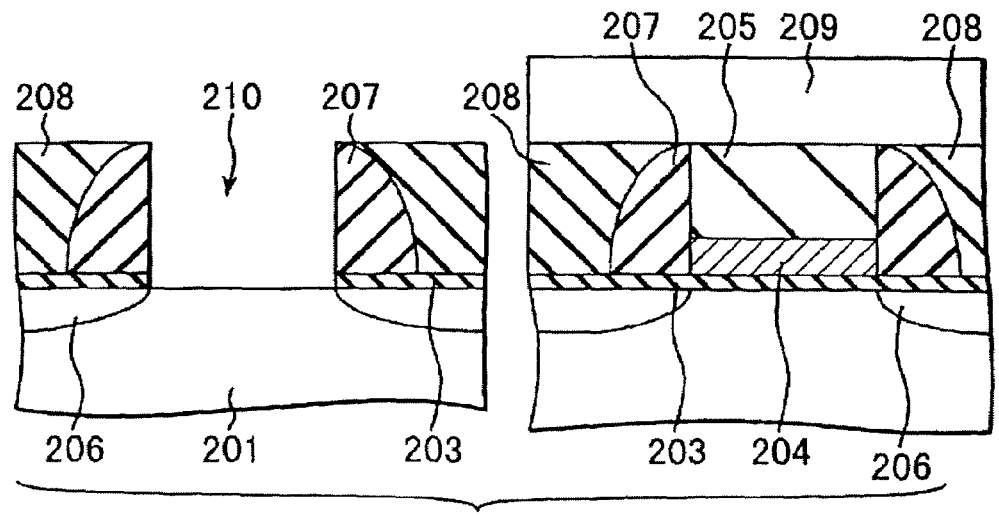
Figure 15D:
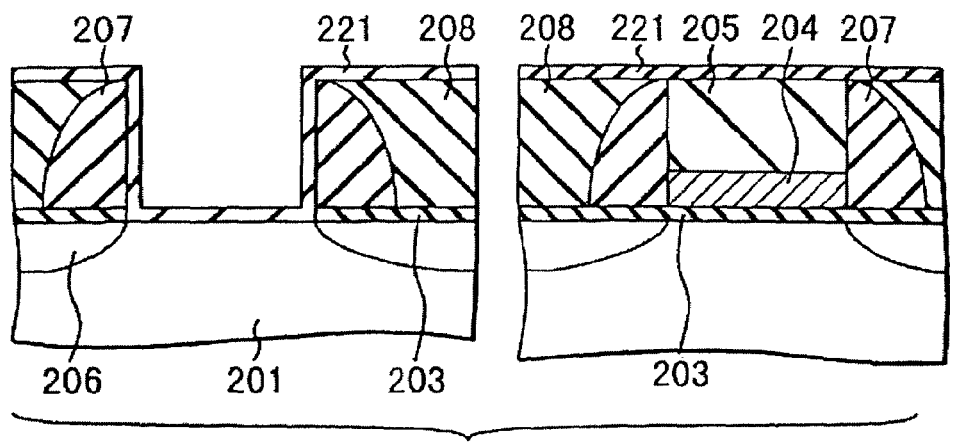
Figure 16A:
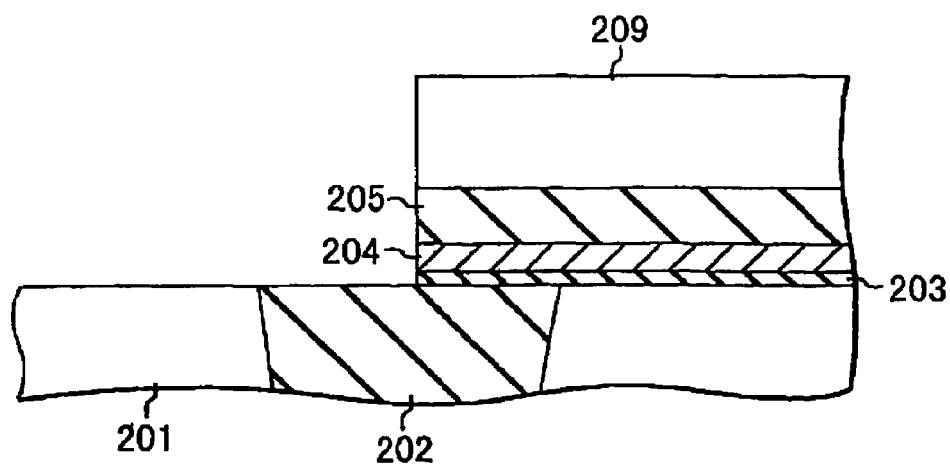
FIGS. 16A to 16E are sectional views explaining the steps of the method according to the fifth embodiment, each view taken along line XIII-XIII shown in FIG. 10.

After performing the step of FIGS. 15C and 16A, a gate insulator film 221, e.g., an SiON film, is deposited on the entire upper surface of the resultant structure. Since the deposited film is used as the gate insulator film 221, the gate insulator film 221 is formed on the side of the silicon oxide side films 207 and on the silicon oxide film 208, as is illustrated in FIG. 15D.

Figure 15E:
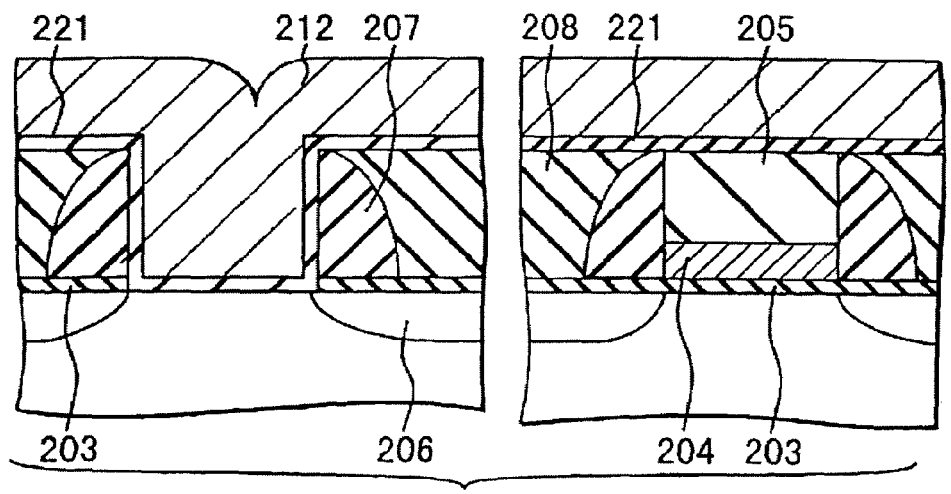
Figure 16B:
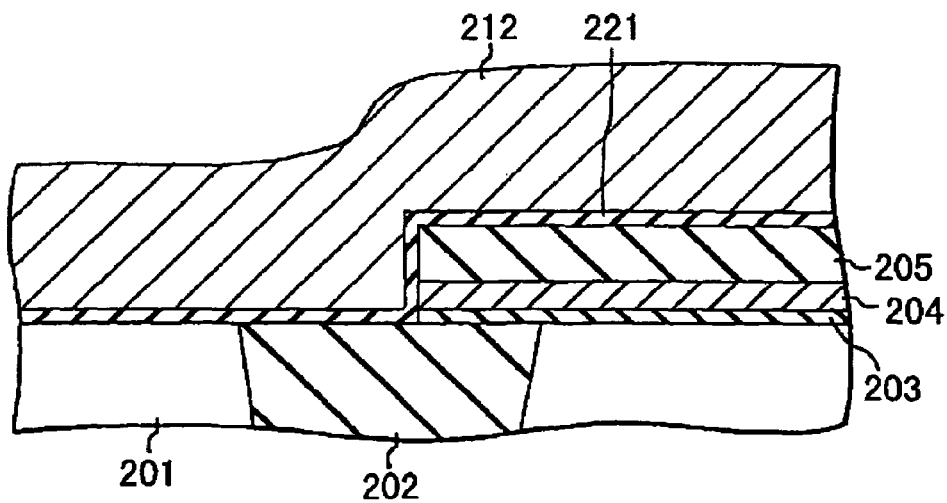

Next, a tungsten film 212 is formed on the gate insulator film 221, filling the groove, as is shown in FIGS. 15E and 16B.

Figure 15F:
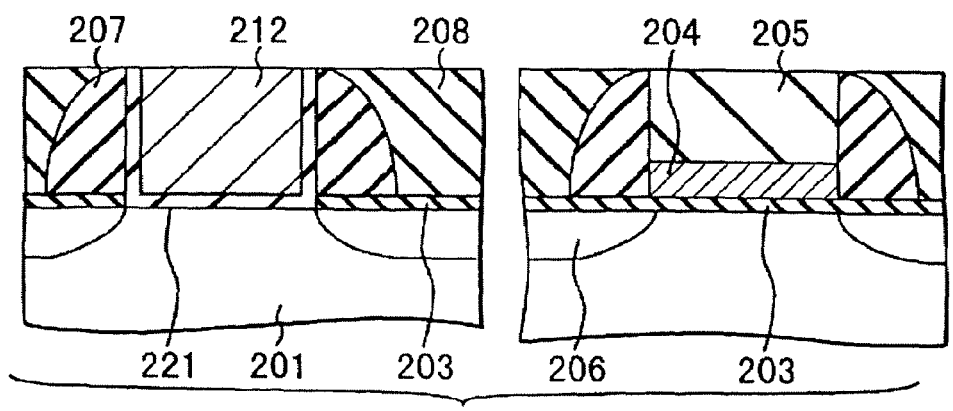
Figure 16C:
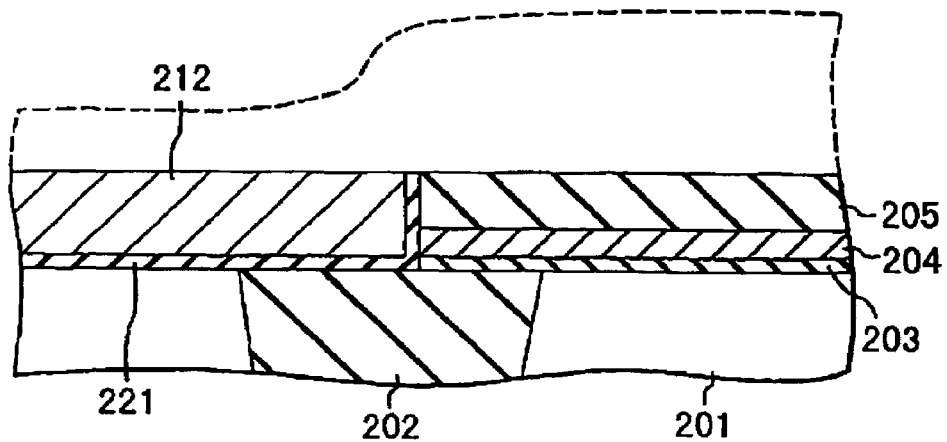

The tungsten film 212 and gate insulator film 221 are removed by CMP method, except the parts filling the groove, as is illustrated in FIGS. 15F and 16C.

Figure 15G:
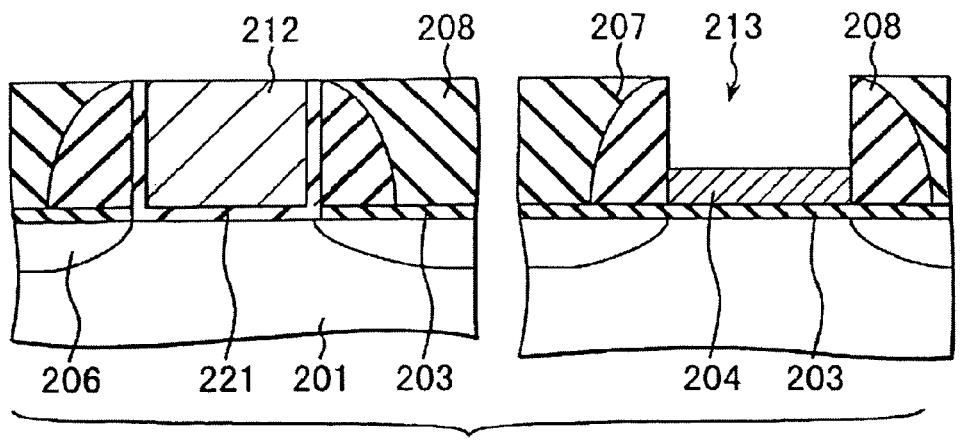

That part of the SiN film 205 which is formed on the polysilicon film 204 is removed, forming a groove 213 and exposing the polysilicon film 204, as is shown in FIG. 15G. Hydrofluoric acid solution is applied, removing that part of the gate insulator film 221 which is connected to the side of the SiN film 205, as shown FIG. 16D.

Figure 15H:
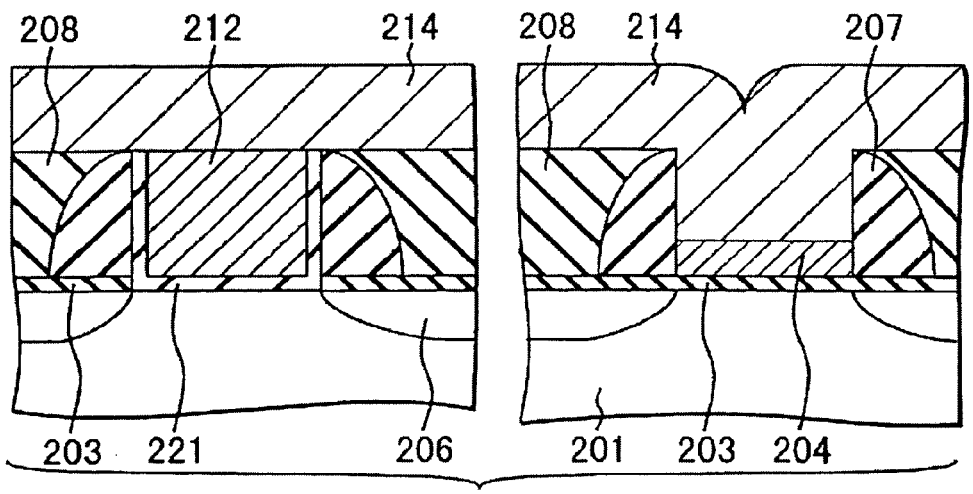
Figure 16D:
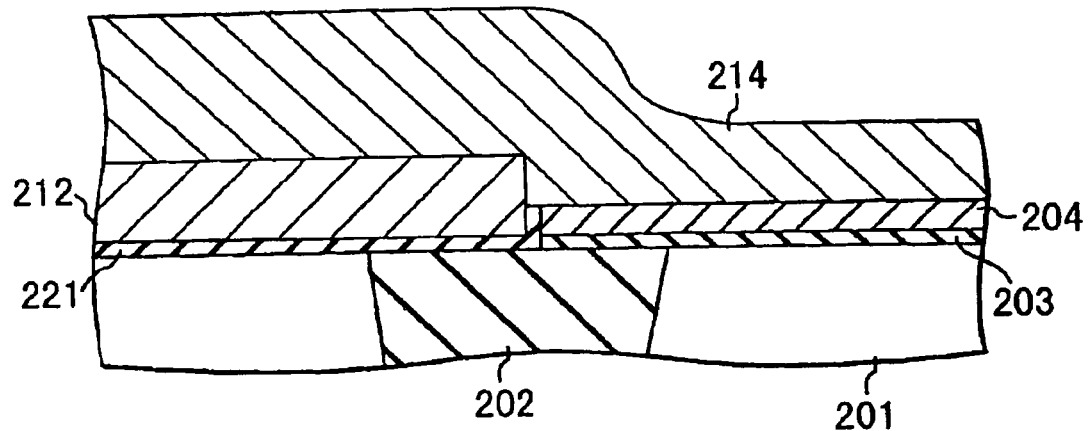

A tungsten film 214 is deposited on the entire upper surface of the resultant structure. However, as described above, the gate insulator film 221 is deposited to cover the side of the polysilicon film 204, as shown in FIG. 16C, the gate insulator film 221 electrically insulates the polysilicon film 204 from the tungsten film 212. Nonetheless, the tungsten film 214 electrically connects the polysilicon film 204 to the tungsten film 212, as is illustrated in FIGS. 15H and 16D.

Figure 15I:
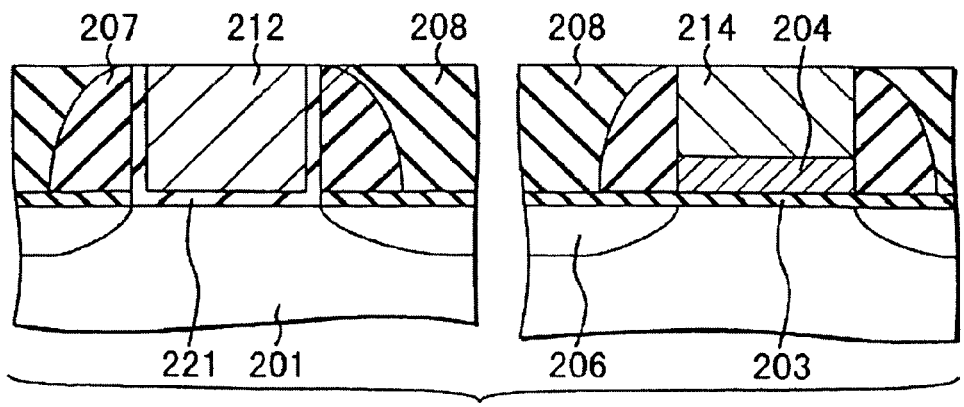
Figure 16E:
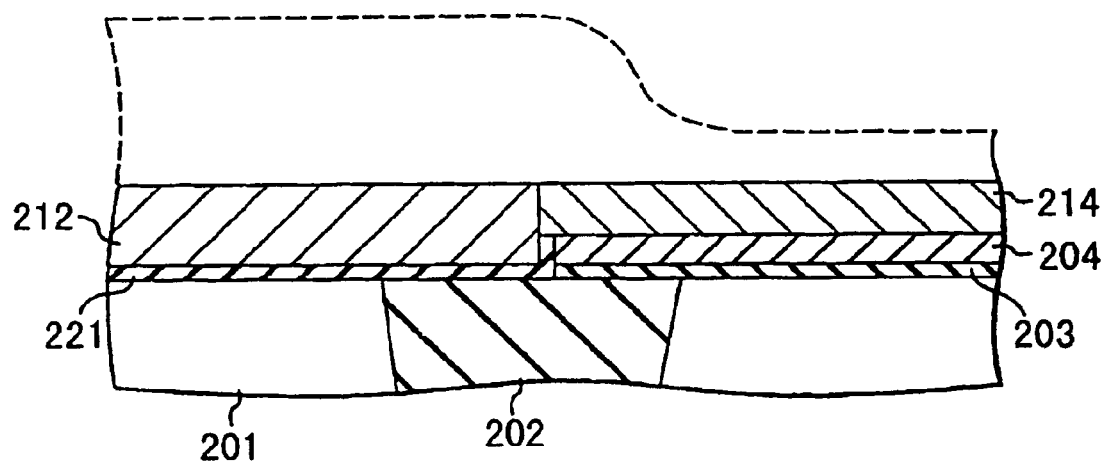

Then, the tungsten film 214 is polished by CMP method, except the part filling in the groove, as is illustrated in FIGS. 15I and 16E.

The major steps have been thus carried out. The first and second transistors having gate insulator films of different types are thereby formed by a relatively simple method.

Thereafter, ordinary wiring steps are performed, forming wires. As a result, a manufacture of the semiconductor integrated circuit device is completed.

Like the fourth embodiment, the fifth embodiment can solve the first and second problems inherent to the device made by the conventional method.

Sixth Embodiment

A method of manufacturing a semiconductor device, according to the sixth embodiment of the present invention, will be descried with reference to FIGS. 17A to 17G and FIGS. 18A to 18E.

The semiconductor device manufactured by the method according to the sixth embodiment looks just the same as the device made by the fourth embodiment when viewed from the above, as is illustrated in FIG. 10. The components similar or identical to those of the device made by the fourth embodiment are designated at the same reference numerals in FIGS. 17A to 17G and FIGS. 18A to 18E, and will not be described in detail.

FIGS. 17A to 17G are sectional views explaining the steps of the method according to the sixth embodiment, each view consisting of a right section taken along line XIa-XIa shown in FIG. 10 and a left section taken along line XIb-XIb shown in FIG. 10. FIGS. 18A to 18E are sectional views explaining the steps of the method according to the sixth embodiment, each view taken along line XIII-XIII shown in FIG. 10.

The steps of the sixth embodiment, shown in FIGS. 17A to 17C and FIG. 18A, are basically identical to the steps of the fourth embodiment, which are illustrated in FIGS. 11A to 11C and FIG. 13A. The components similar or identical to those of the device made by the fourth embodiment are designated at the same reference numerals in FIGS. 17A to 17G and FIGS. 18A to 16F, and will not be described in detail. The steps following these will be described below.

Figure 17A:
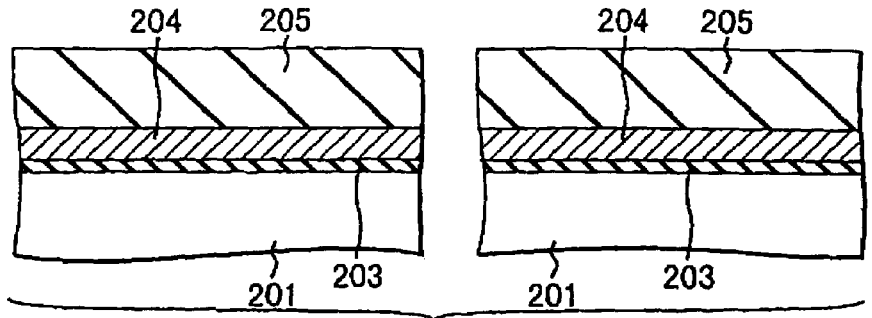
FIGS. 17A to 17G are sectional views explaining the steps of the method according to the sixth embodiment, each view consisting of a right section taken along line XIa-XIa shown in FIG. 10 and a left section taken along line XIb-XIb shown in FIG. 10.
Figure 17B:
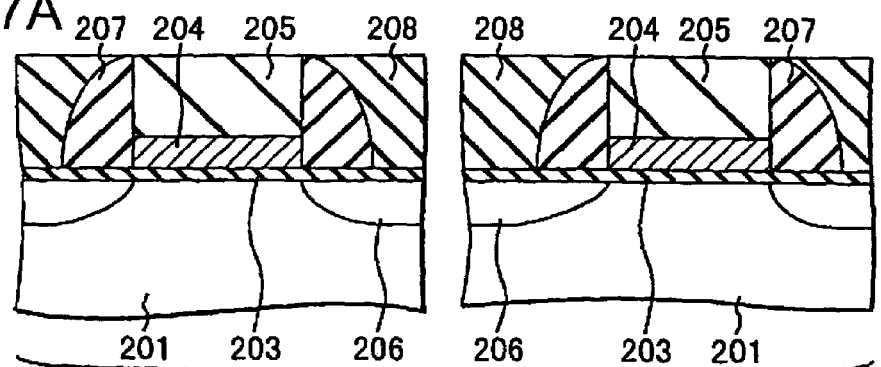
Figure 17C:
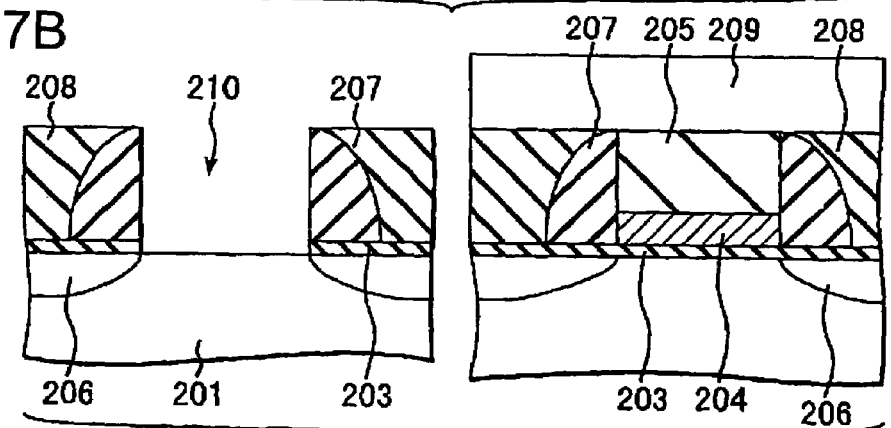
Figure 17D:
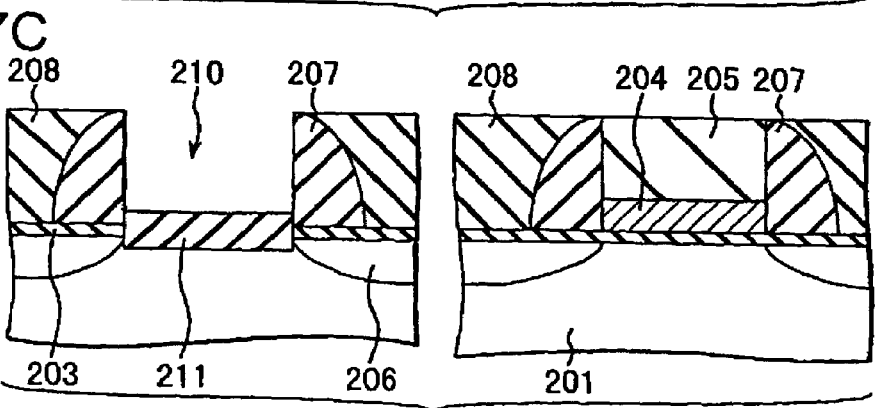
Figure 18A:
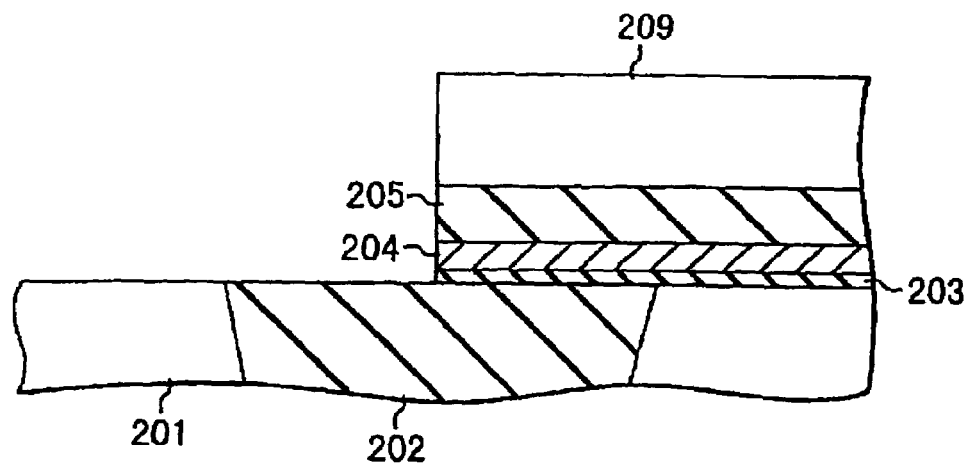
FIGS. 18A to 18E are sectional views explaining the steps of the method according to the sixth embodiment, each view taken along line XIII-XIII shown in FIG. 10.
Figure 18B:
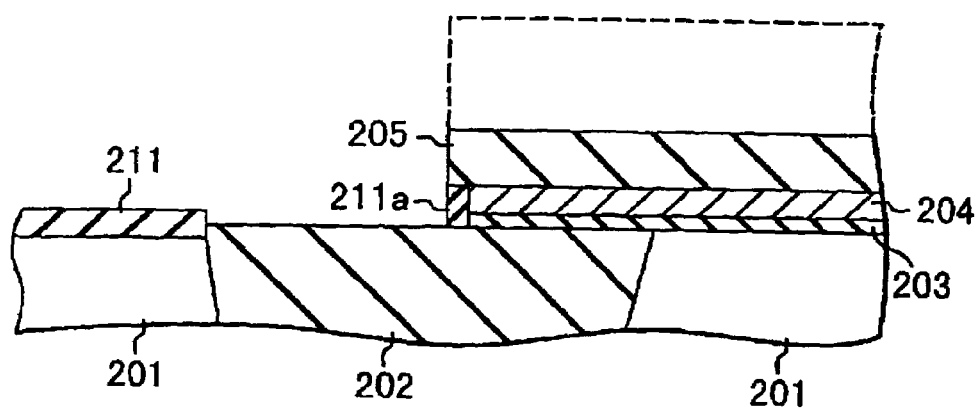

After performing the step of FIGS. 17C and 18A, a gate insulator film 211 is formed by thermal oxidation on the that part of the silicon substrate 201 which is exposed in the groove, as is illustrated in FIGS. 17D and 18B.

Figure 17E:
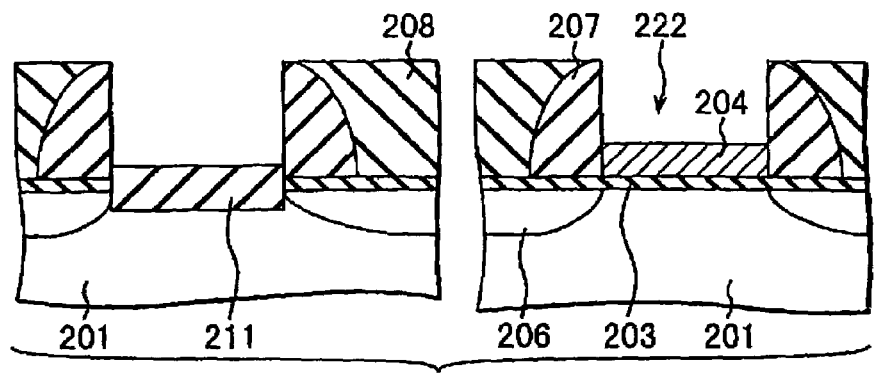
Figure 18C:
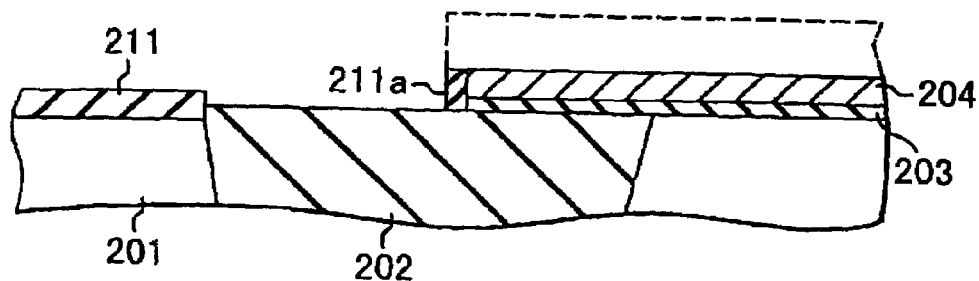

As shown in FIGS. 17E and 18C, the SiN film 205 is removed. The polysilicon film 204 is thereby exposed, and a groove 222 is formed in the silicon oxide film 208.

Figure 17F:
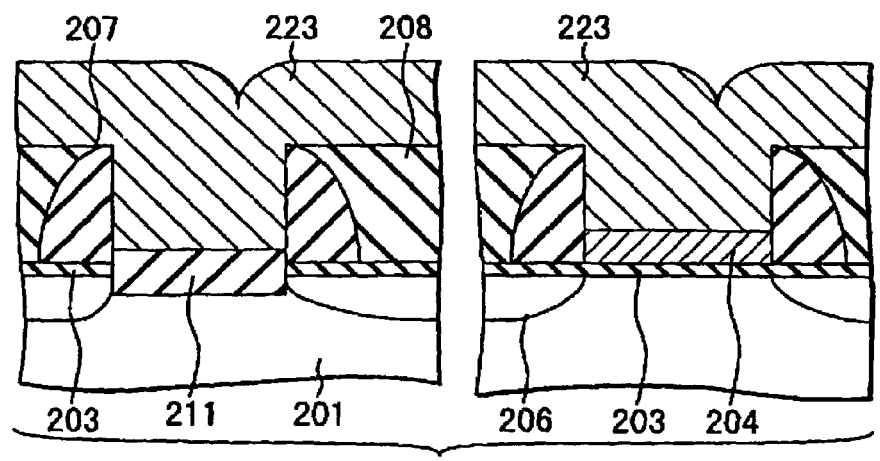
Figure 18D:
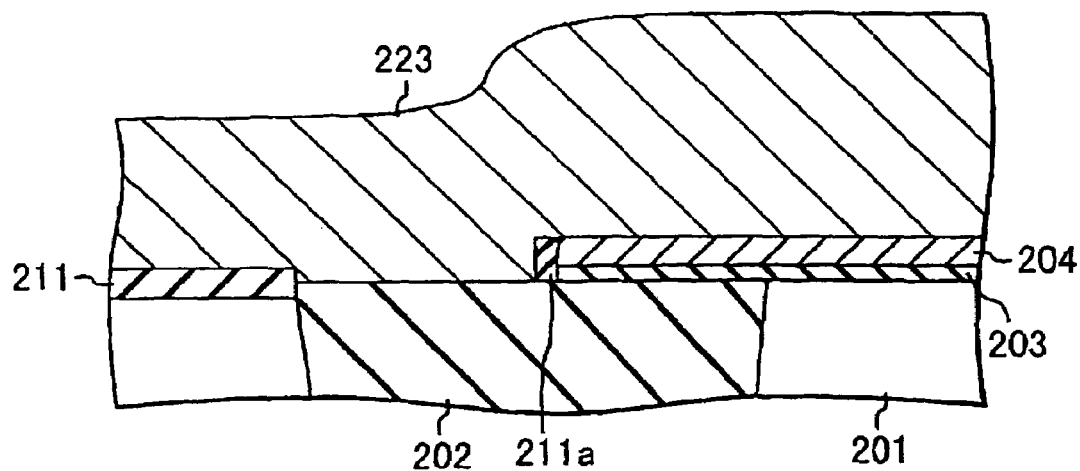

Next, as shown in FIGS. 17F and 18D, a tungsten film 223 is deposited on the entire upper surface of the resultant structure. When the gate oxide film 211 is formed, the sides of the polysilicon film 204 are oxidized, forming oxide films 211a (FIG. 18B). These oxide films 211a electrically insulate the tungsten film 212 from the polysilicon film 204. However, the upper surface of the 204 is electrically contacted to the tungsten film 223. If the gate insulator film 211 is formed of a deposited film, it would be difficult to remove the gate insulator film, which is formed on the silicon nitride film 205. It is therefore desired that the gate insulator film 211 be an oxide film formed by heat treatment, a nitride film formed by heat treatment, or a composite film made of these films.

Figure 17G:
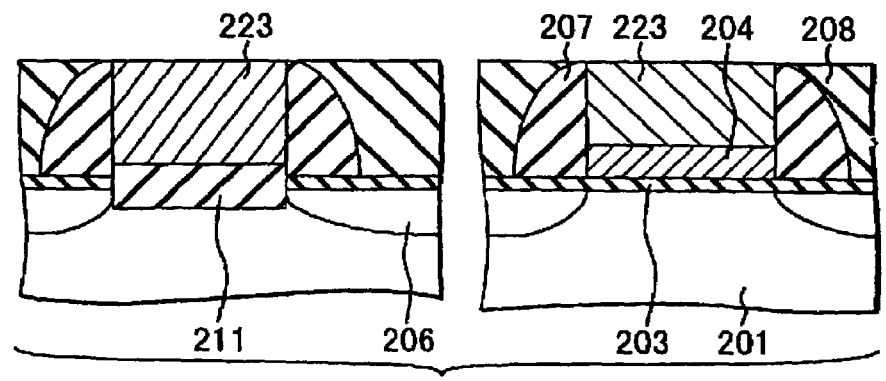
Figure 18E:
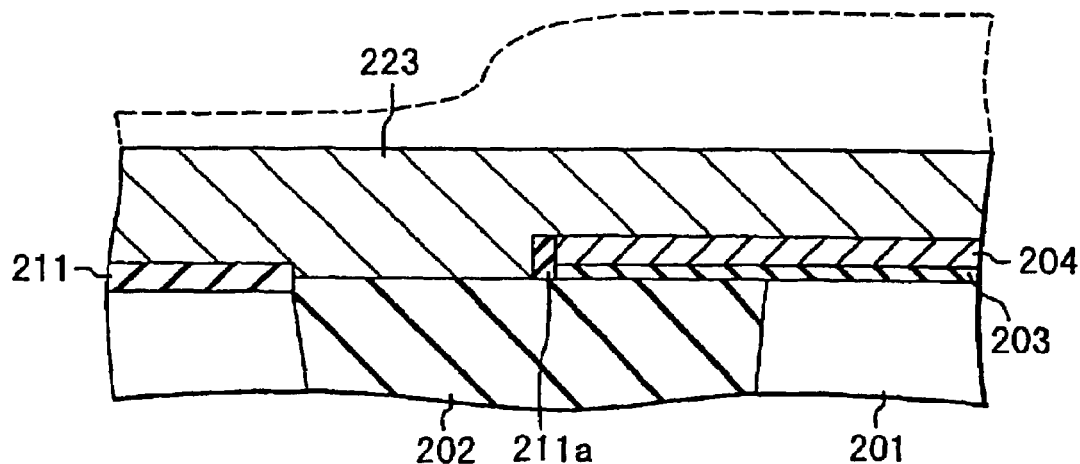

Further, the tungsten film 223 is polished by CMP method, except the part filling the groove 222, as is illustrated in FIGS. 17G and 18E.

The major steps have been thus carried out. The first and second transistors having gate insulator films of different types are thereby formed by a relatively simple method. Then, ordinary wiring steps are performed, forming wires. As a result, a manufacture of the semiconductor integrated circuit is completed.

According to the sixth embodiment, a manufacturing process of the device is made simpler since the step of forming damascene gate is performed only once, as shown in FIGS. 17C to 17G.

Four types of semiconductor devices manufactured by the method according to the fourth, fifth or sixth embodiment, described above, will be described with reference to FIGS. 19A and 19B and FIGS. 20A and 20B.

The components similar or identical to those of the device made by the fourth embodiment are designated at the same reference numerals in FIGS. 19A to 19B and FIGS. 20A to 20B, and will not be described in detail.

Figure 19A:
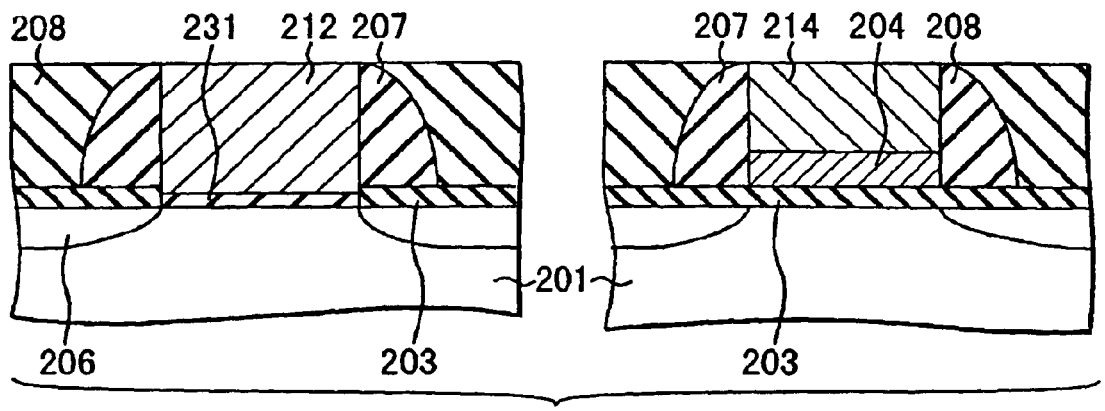
FIGS. 19A and 19B are sectional views showing a type of a semiconductor device manufactured by the method according to the fourth embodiment.
Figure 19B:
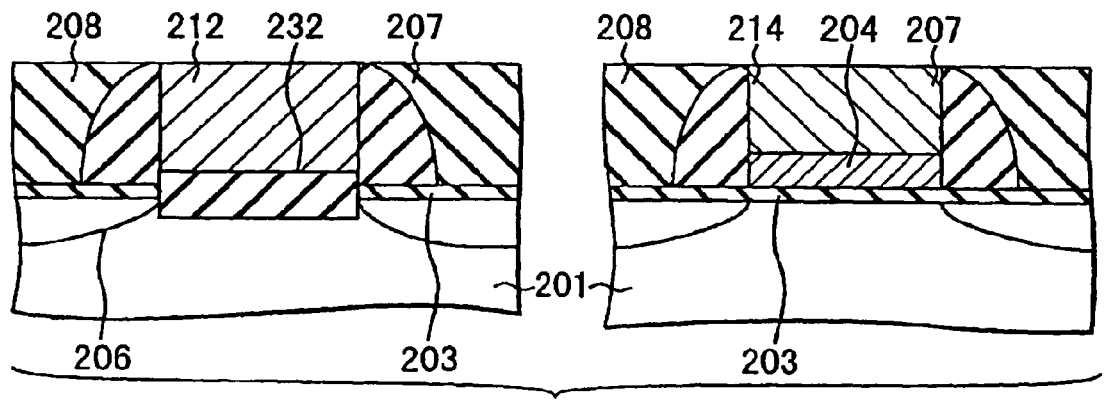

FIG. 19A is sectional views of a DRAM (Dynamic Random Access Memory) comprising the first and second transistors manufactured by the fourth, fifth or sixth embodiment of the present invention. The first transistor shown in the right sectional view is used in a memory cell, whereas the second transistor shown in the left sectional view is used in a logic section. Including the first transistor having a relatively thick silicon oxide film 203, the memory cell can operate with high reliability. Including the second transistor having a thin silicon oxide film 231, the logic section operates at high speed. FIG. 19B is sectional views of a FeRAM (Ferroelectric Random Access Memory) comprising the first and second transistors manufactured by the fourth, fifth or sixth embodiment of the present invention. The first transistor shown in the right sectional view is used in a logic section, whereas the second transistor shown in the left sectional view is used in a memory cell. Namely, the logic section has a silicon oxide film 203, and the memory cell has a ferroelectric film 232.

Figure 20A:
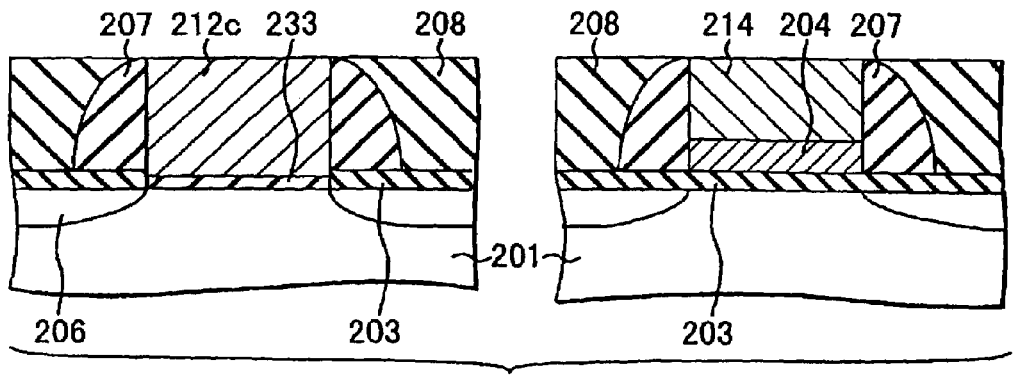
FIGS. 20A and 20B are sectional views showing another type of a semiconductor device manufactured by the method according to the fourth embodiment.

FIG. 20A is sectional views of an EEPROM (nonvolatile memory) comprising the first and second transistors manufactured by the fourth, fifth or sixth embodiment of the present invention. The first transistor shown in the right sectional view is used in a logic section, whereas the second transistor shown in the left sectional view is used in a memory cell. The logic section has a silicon oxide film 203, and the memory cell has an oxynitride film 233 which should long function reliably as a tunnel oxide film. The second transistor incorporated in the memory cell has a gate made of polysilicon film 212a, instead of a tungsten film.

Figure 20B:
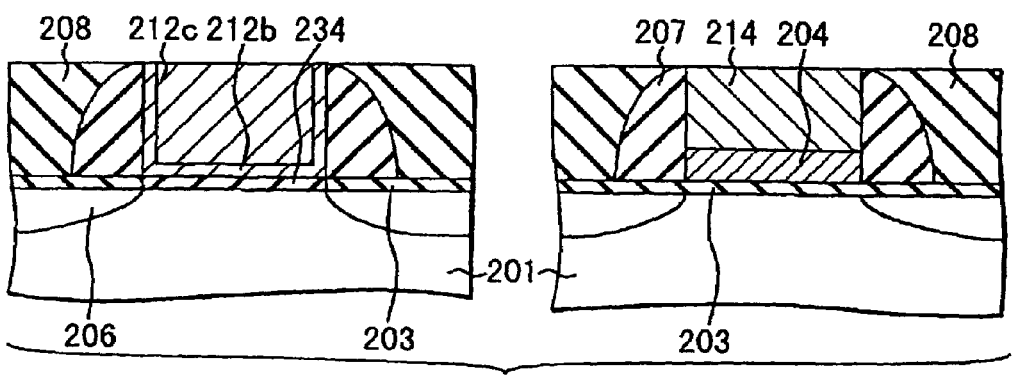

FIG. 20B is sectional views of a CMOS high-speed logic device comprising the first and second transistors manufactured by the fourth, fifth or sixth embodiment of the present invention. The first transistor shown in the right sectional view is an n-channel transistor, while the second transistor shown in the left sectional view is a p-channel transistor. The n-channel transistor has a silicon oxide film 203, and the p-channel transistor has an oxynitride film 234. In the n-channel transistor, n-type impurities have been introduced into the polysilicon film 204 which functions as the gate electrode. In the p-channel transistor, p-type impurities have been introduced into the polysilicon film 212b which constitutes the gate electrode, together with the tungsten film 212c. This structure is free of the problem inherent to a conventional surface-channel type p-channel transistor. That is, boron would not diffuse from the p-type polysilicon film into the substrate through the gate insulator film as in the conventional surface-channel type p-channel transistor. The gate of the p-channel transistor may be formed of only polysilicon film containing p-type impurities. In this case, too, the tungsten film 214 reliably connects the n-type polysilicon film used as the gate electrode of the n-channel transistor to the p-type polysilicon film used as the gate electrode of the p-channel transistor.

As can be understood from the above, the methods according to the fourth to sixth embodiments can easily and reliably form a plurality of transistors which differ in the material and thickness of the gate insulator film. Hence, these methods can manufacture integrated circuits which operate not only with high reliability, but also at high speed.

Seventh Embodiment

A method of manufacturing a semiconductor device, according to the seventh embodiment of the present invention, will be descried with reference to FIGS. 21A to 21E and FIGS. 22A to 22E.

The semiconductor device manufactured by the method according to the seventh embodiment looks just the same as the device made by the fourth embodiment when viewed from the above, as is illustrated in FIG. 10. The components similar or identical to those of the device made by the fourth embodiment are designated at the same reference numerals in FIGS. 21A to 21E and FIGS. 22A to 22E, and will not be described in detail.

FIGS. 21A to 21E are sectional views explaining the steps of the method according to the seventh embodiment, each view consisting of a right section taken along line XIa-XIa shown in FIG. 10 and a left section taken along line XIb-XIb shown in FIG. 10. FIGS. 22A to 22E are sectional views explaining the steps of the method according to the seventh embodiment, each view taken along line XIII-XIII shown in FIG. 10.

Figure 21A:
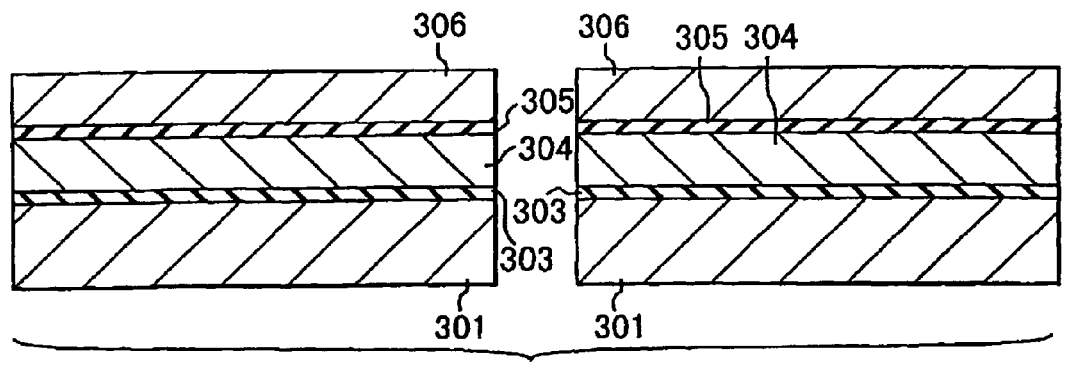
FIGS. 21A to 21E are sectional views explaining the steps of the method according to the seventh embodiment, each view consisting of a right section taken along line XIa-XIa shown in FIG. 10 and a left section taken along line XIb-XIb shown in FIG. 10.
Figure 22A:
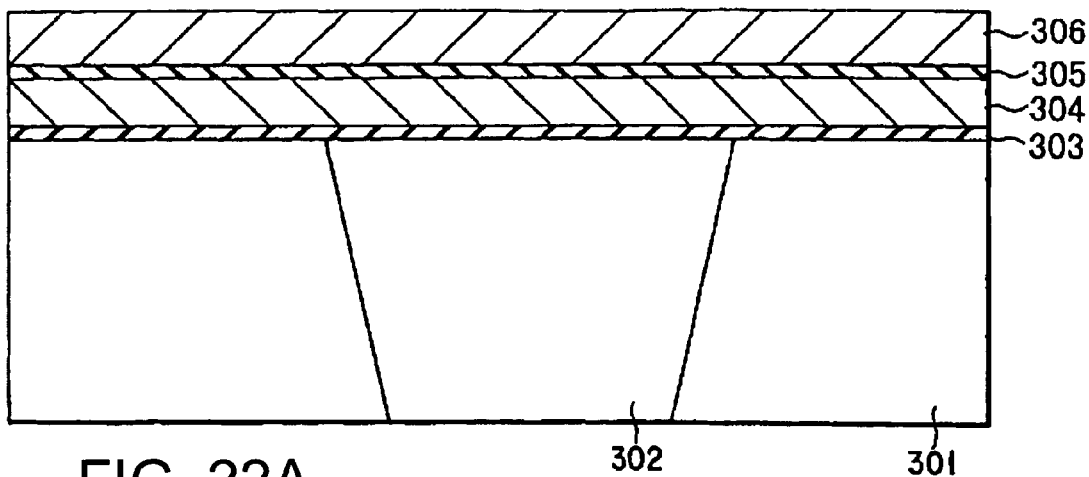
FIGS. 22A to 22E are sectional views explaining the steps of the method according to the seventh embodiment, each view taken along line XIII-XIII shown in FIG. 10.

At first, as shown in FIGS. 21A and 22A, a well region (not shown) and an trench isolation 302 of STI structure are formed in a silicon substrate 301. Then, a first gate oxide film 303 is formed on the substrate 301 by means of thermal oxidation. A polysilicon film 304, which will become a first gate electrode, is formed on the first gate oxide film 303 by means of either CVD method or sputtering method. Further, a tungsten nitride film 305 is formed on the polysilicon film 304, and a tungsten film 306 is formed on the tungsten nitride film 305, by either CVD method or sputtering method. Dopant impurities are added to the polysilicon film 304 while the film 304 is being formed, or ion-implanted into the film 304 after the film 304 has been formed.

Figure 21B:
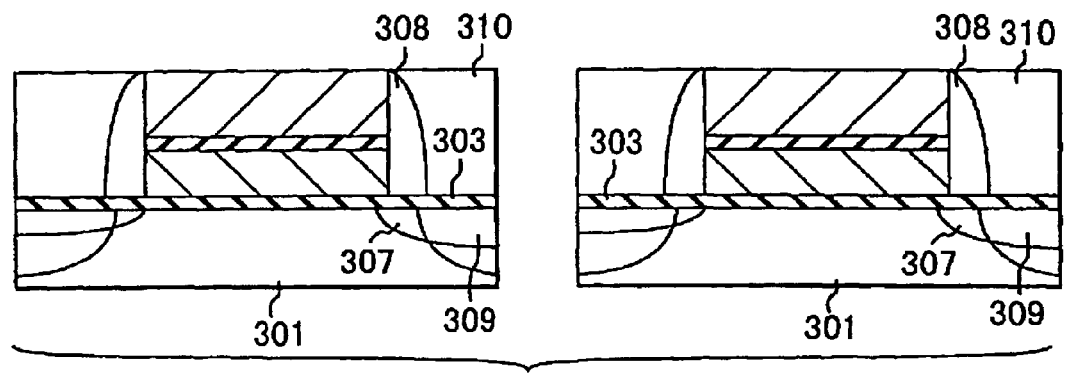
Figure 22B:
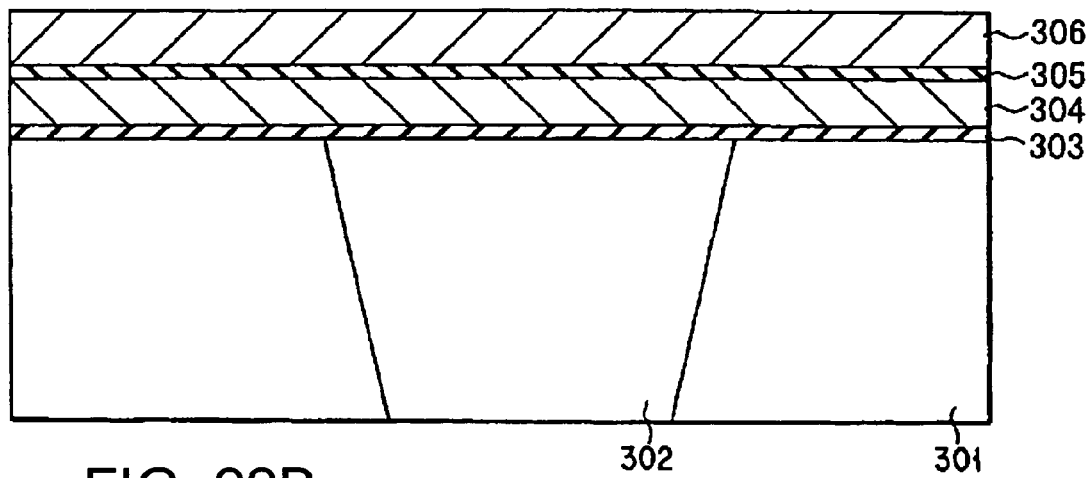

The composite film, composed of the polysilicon film 304, tungsten nitride film 305 and tungsten film 306, is patterned by lithography and dry etching, thereby forming gate-wiring pattern. Using the gate-wiring pattern as a mask, impurities are ion-implanted, thereby forming an LDD (Lightly Doped Drain) layer 307. Silicon oxide films 308 are then formed on the sides of the gate-wiring pattern. Using the resultant gate-wiring structure as a mask, impurities are ion-implanted. Thereafter, rapid thermal annealing (RTA) is performed within a short time, thereby forming a source diffusion region 309 and a drain diffusion region 309. Further a silicon oxide film 310 is formed by CVD method on the entire upper surface of the resultant structure. Still further, chemical mechanical polishing is performed on the silicon oxide film 301, using the tungsten film 306 as a stopper. The resultant structure therefore has a flat upper surface as is illustrated in FIGS. 21B and 22B.

Figure 21C:
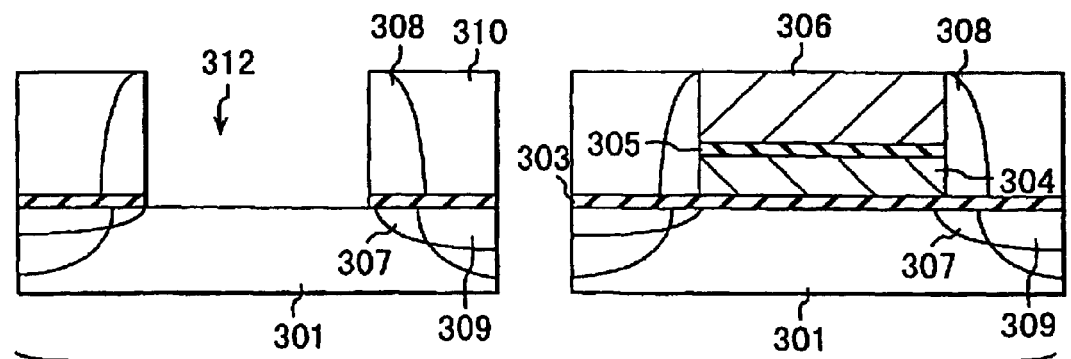
Figure 22C:
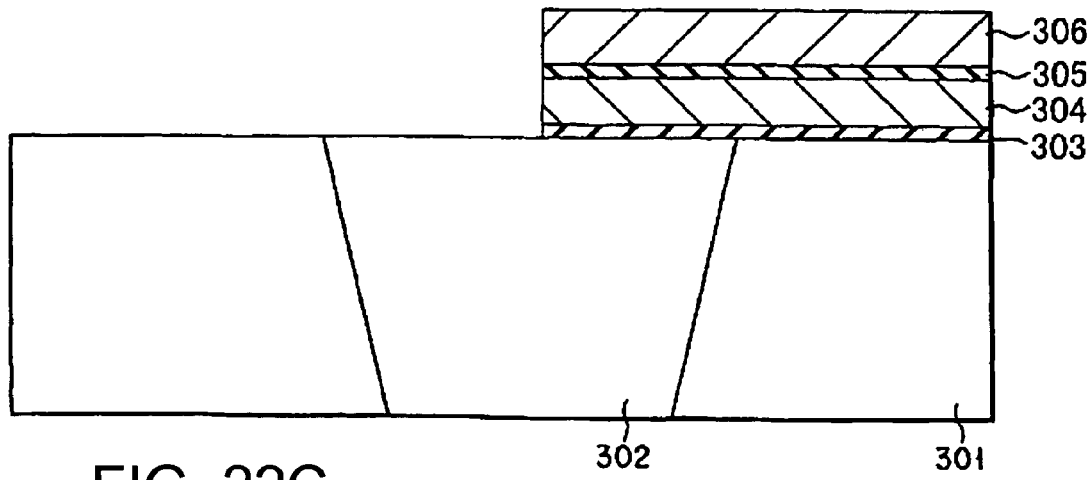

Next, a photoresist is coated on the region in which a first transistor will be formed. A mixture solution of sulfuric acid and hydrogen peroxide is applied, removing the composite film made of the first tungsten film 306 and first tungsten nitride film 305, except the part covered by the photoresist. Further, hydrazine solution is applied, removing the polysilicon film 304, except the part covered by the photoresist. A groove 312 is thereby made in the region where the gate electrode of a second transistor will be formed. Impurities are ion-implanted into the channel region through that part of the gate oxide film 303 which is exposed at the bottom of the groove 312. Thereafter, diluted hydrofluoric acid is applied, removing the exposed part of the oxide film 303, as is illustrated in FIGS. 21C and 22C.

Figure 21D:
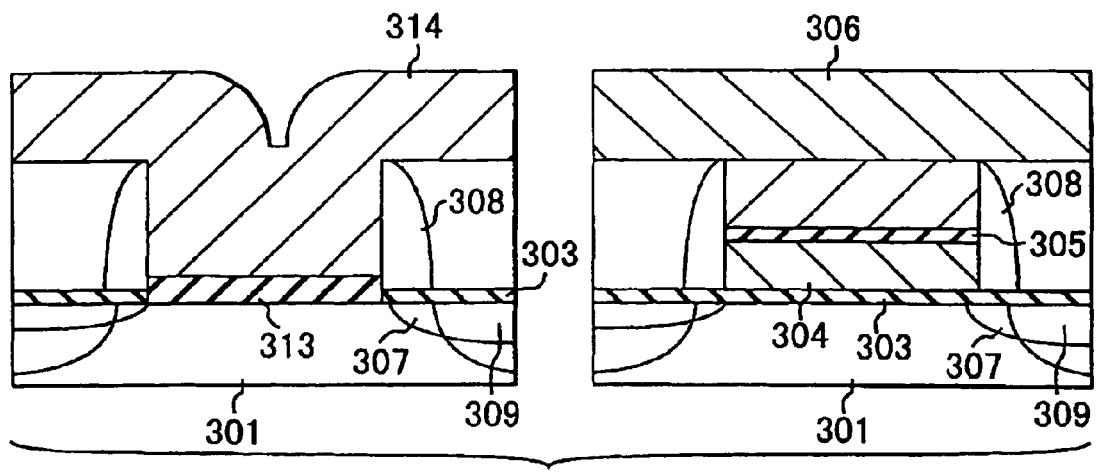
Figure 22D:
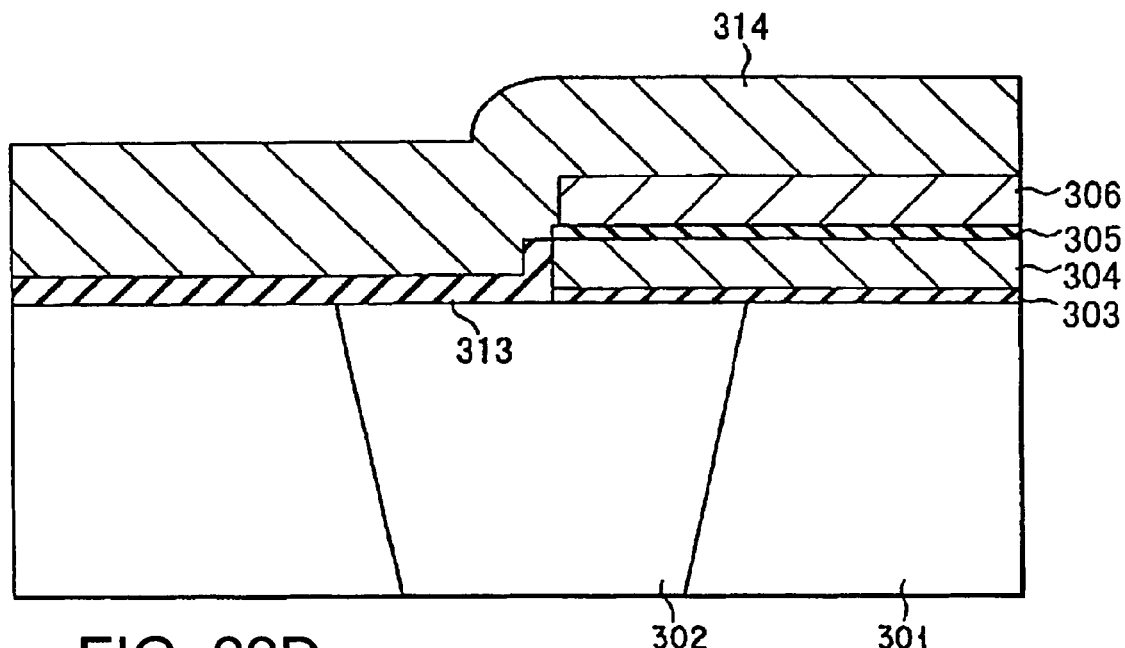

Then, the silicon substrate 301 is subjected to selective oxidation in an atmosphere containing a mixture of hydrogen and water vapor, without oxidizing tungsten as is disclosed in U.S. patent application Ser. No. 08/701,716. The surface of that part of the substrate 301, which is exposed at the bottom of the groove 312, is thereby oxidized, forming a second gate insulator film 313, as is shown in FIGS. 21D and 22D. For example, a gate insulator film about 50 Å thick may be formed, without oxidizing tungsten, in an atmosphere into which hydrogen, water vapor and diluted hydrogen are supplied at flow-rate ratio of 2.7:1:14.4 for one hour at 85° C. and 200 torr. Thereafter, a second tungsten film 314 is formed on all upper surface of the resultant structure. If the second gate insulator film were formed by means ordinary thermal oxidation, not only the sides of the polysilicon film 304, but also the tungsten film 306 should be oxidized, inevitably electrically insulating the first tungsten film 306 and the second tungsten film 314. Since the silicon substrate 301 has been subjected to selective oxidation, however, the first tungsten film 306 and the second tungsten film 314 are electrically connected to each other as shown in FIGS. 21D and 22D.

Figure 21E:
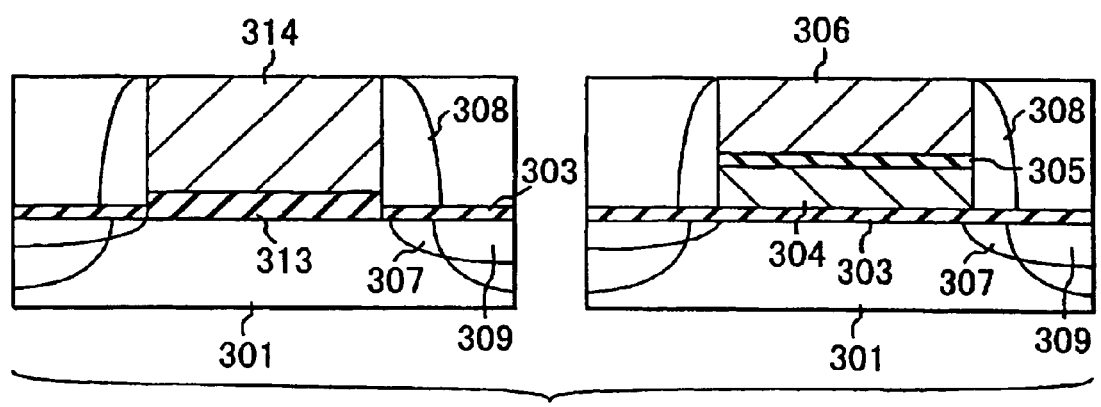
Figure 22E:
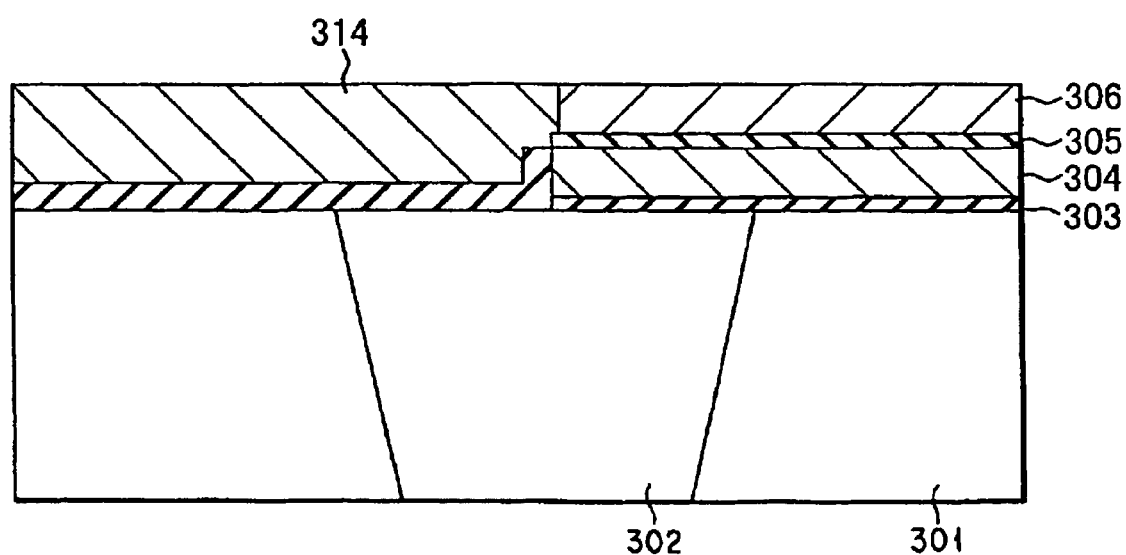

Further, the tungsten film is removed by CMP method, except the part filling the groove 312, as is illustrated in FIGS. 21E and 22E.

The major manufacturing steps are thus completed, forming the first and second transistors, which differ in the gate-wiring structure, by a relatively simple method. Thereafter, ordinary wiring steps are carried out, forming wires. As a result, a manufacture of the semiconductor integrated circuit of the seventh embodiment is completed.

As can be understood from the above, the method according to the seventh embodiment can easily and reliably form a plurality of transistors which differ in the type and thickness of the gate insulator film and gate electrode, just like the methods according to the first to sixth embodiments. Hence, the method according to the seventh embodiment can manufacture integrated circuits which operate not only with high reliability, but also at high speed. Particularly in the seventh embodiment, which includes a step of selective oxidation of the substrate, it is unnecessary to coat a photoresist on the region in which the first transistor will be formed.

Eighth Embodiment

A method of manufacturing a semiconductor device, according to the eighth embodiment of the present invention, will be descried with reference to FIGS. 23A to 23E and FIGS. 24A to 24E.

The semiconductor device manufactured by the method according to the eighth embodiment looks just the same as the device made by the fourth embodiment when viewed from the above, as is illustrated in FIG. 10.

FIGS. 23A to 23E are sectional views explaining the steps of the eighth embodiment, each view consisting of a right section taken along line XIa-XIa shown in FIG. 10 and a left section taken along line XIb-XIb shown in FIG. 10. FIGS. 24A to 24E are sectional views explaining the steps of the eighth embodiment, each view taken along line XIII-XIII shown in FIG. 10.

Figure 23A:
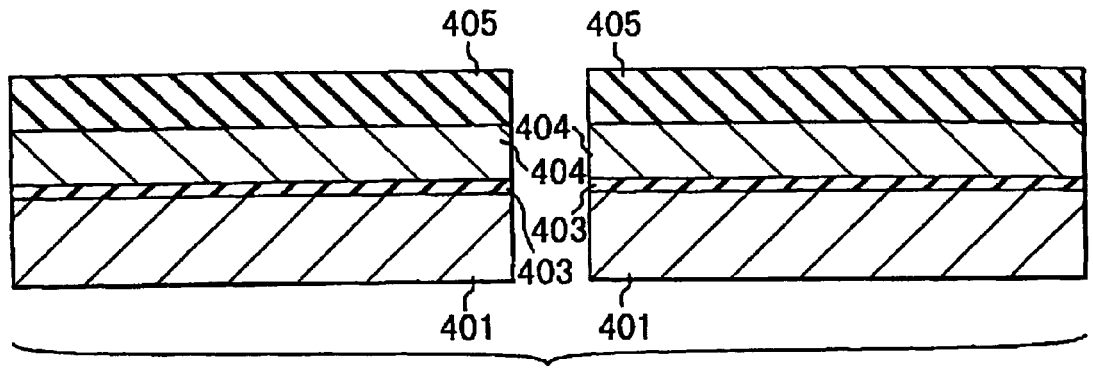
FIGS. 23A to 23E are sectional views explaining the steps of the method according to the eighth embodiment, each view consisting of a right section taken along line XIa-XIa shown in FIG. 10 and a left section taken along line XIb-XIb shown in FIG. 10.
Figure 24A:
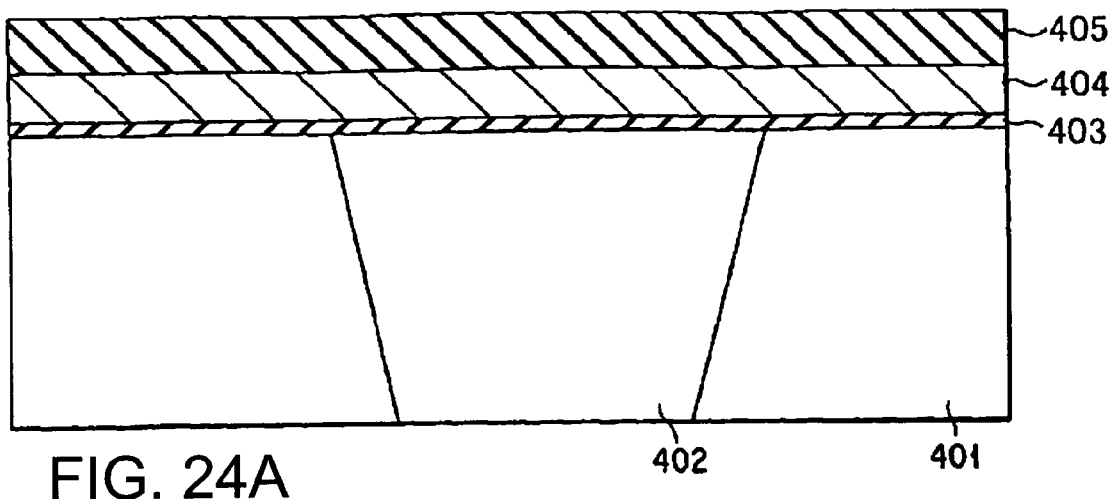
FIGS. 24A to 24E are sectional views explaining the steps of the method according to the eighth embodiment, each view taken along line XIII-XIII shown in FIG. 10.

At first, as shown in FIGS. 23A and 24A, a well region (not shown) and an trench isolation 402 of STI structure are formed in a silicon substrate 401. Then, a first gate oxide film 403 is formed on the substrate 401 by means of thermal oxidation. A polysilicon film 404, which will become a first gate electrode, is formed on the first gate oxide film 403 by means of CVD method. Further, a silicon nitride film 405 is formed on the polysilicon film 404 by CVD method. Dopant impurities are added to the polysilicon film 404 while the film 404 is being formed, or ion-implanted into the film 404 after the film 404 has been formed.

Figure 23B:
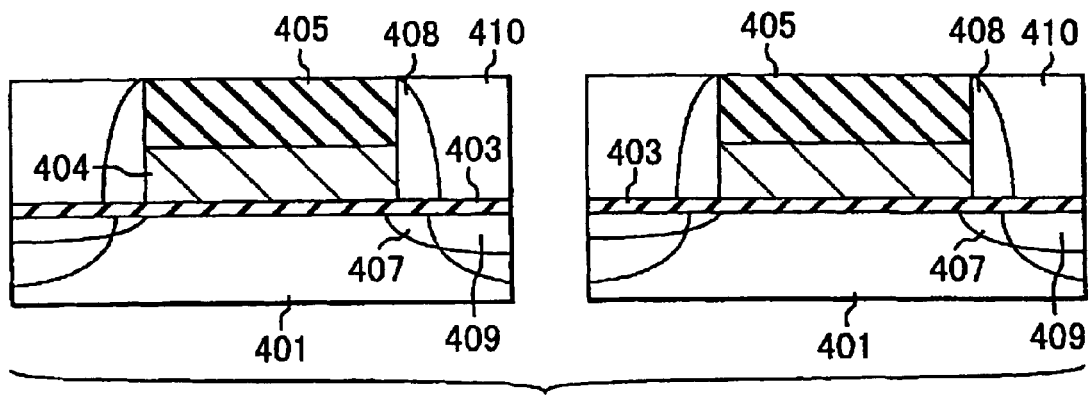
Figure 24B:
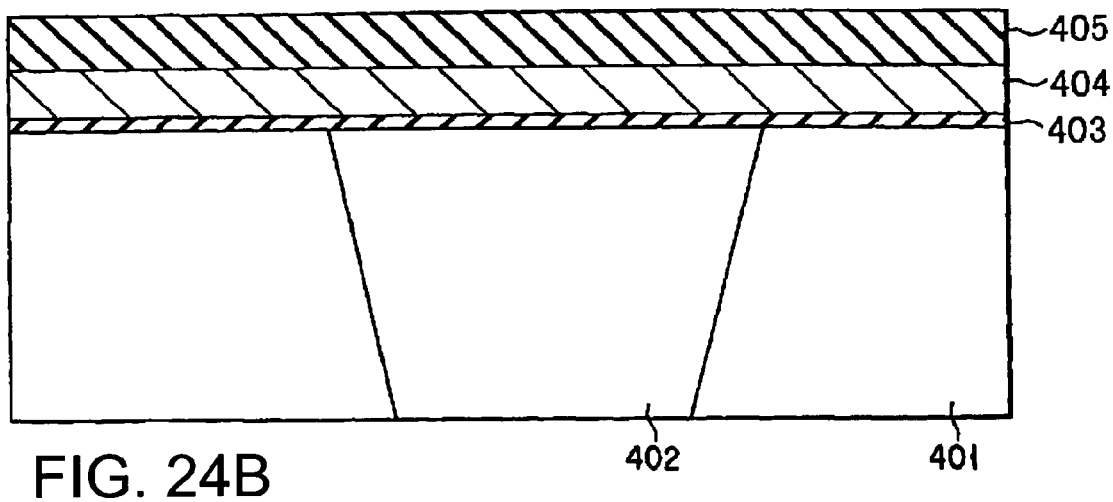

The composite film, composed of the polysilicon film 404 and silicon nitride film 405 is patterned by lithography and dry etching, thereby forming gate-wiring pattern. Using the gate-wiring pattern as a mask, impurities are ion-implanted, thereby forming an LDD (Lightly Doped Drain) layer 407. Silicon oxide films 408 are then formed on the sides of the gate-wiring pattern. Using the resultant gate-wiring structure as a mask, impurities are ion-implanted. Thereafter, heat treatment is performed, thereby forming a source diffusion region 409 and a drain diffusion region 409. Further a silicon oxide film 410 is formed by CVD method on the entire upper surface of the resultant structure. Still further, chemical mechanical polishing (CMP) is performed on the silicon oxide film 501, using the silicon nitride film 405 as a stopper. The resultant structure therefore has a flat upper surface as is illustrated in FIGS. 23B and 24B.

Figure 23C:
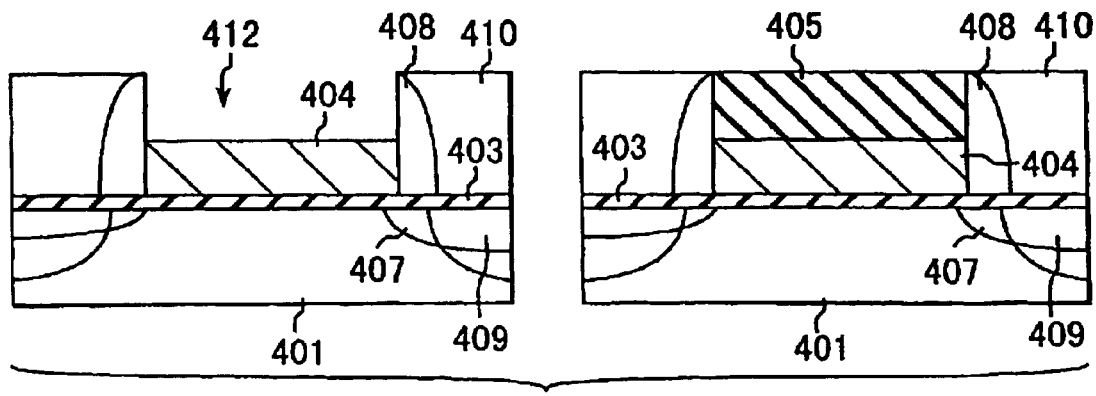
Figure 24C:
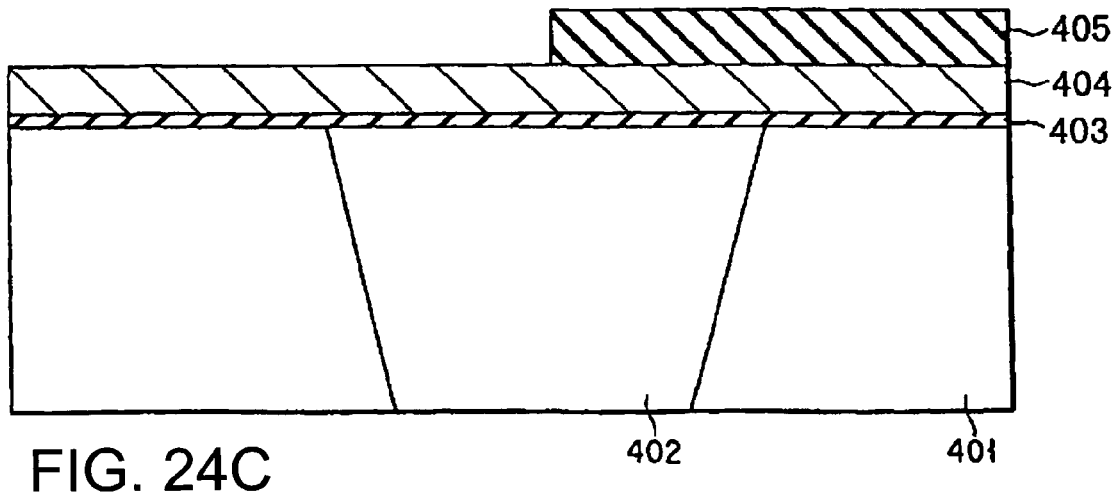

Then, a photoresist is coated, covering the region in which a first transistor will be formed, and an $Si_3N_4$ film is removed by applying, for example, heated phosphoric acid solution. A groove 412 is thereby made, as is illustrated in FIGS. 23C and 24C.

Figure 23D:
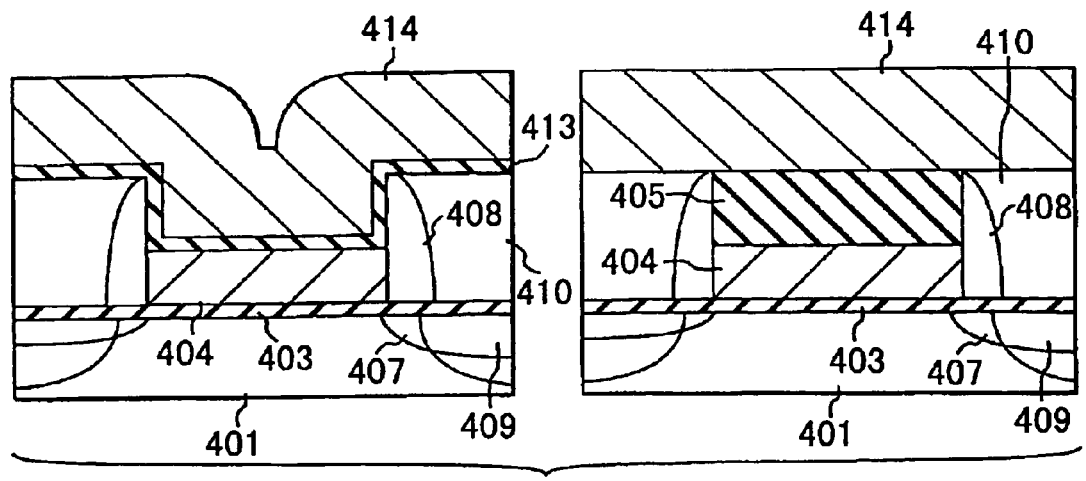
Figure 24D:
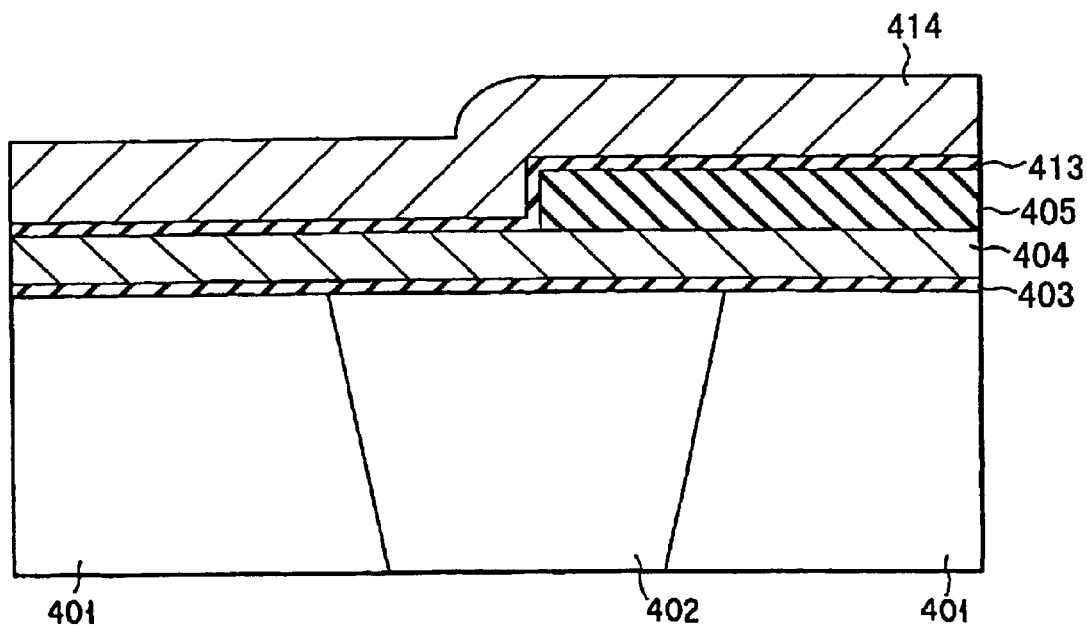

Next, as shown in FIGS. 23D and 24D, a tungsten nitride film 413 is formed on the entire upper surface of the resultant structure, and a tungsten film 414 is formed on the tungsten nitride film 413.

Figure 23E:
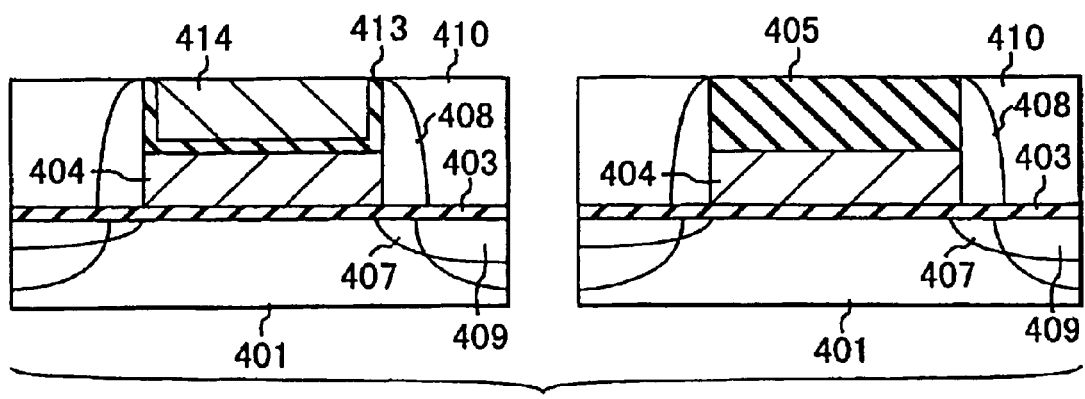
Figure 24E:
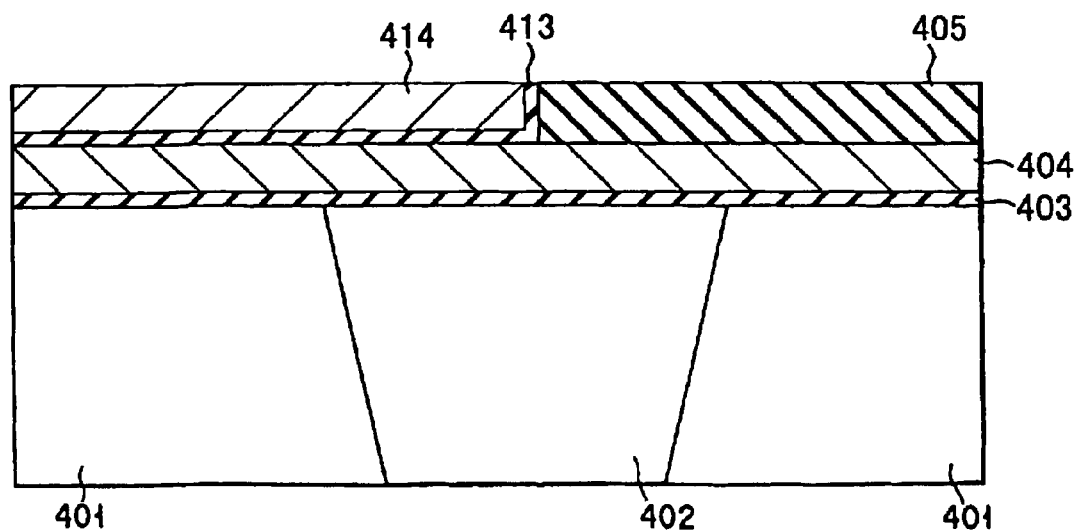

The tungsten nitride film 413 and tungsten film 414 are then removed by CMP method, except the parts that are provided in the groove 412, as is illustrated in FIGS. 23E and 24E. Thus, the tungsten nitride-film 413 and tungsten film 414 are left in the groove 412.

The major manufacturing steps are thus completed, forming the first and second transistors, which differ in the gate-wiring structure, by a relatively simple method. Thereafter, ordinary wiring steps are carried out, forming wires. As a result, a manufacture of the semiconductor integrated circuit of the seventh embodiment is completed.

The method according to the eighth embodiment, described above, can easily and reliably form a plurality of transistors which differ in the type and thickness of the gate insulator film and gate electrode. Hence, the eighth embodiment can manufacture integrated circuit devices which operate not only with high reliability, but also at high speed.

As can be understood from the first to eighth embodiments described above, the present invention can provide a semiconductor device which comprises gate oxide films and/or gate electrodes formed on the same substrate, made of different materials and/or being different in thickness, and can provide also a method of manufacturing this semiconductor device. In particular, the present invention can provide a semiconductor device, in which damascene gates are formed and no photoresist contacts the gate insulator film during the manufacture and in which the junction between any adjacent gate electrodes has only a small area.

In the present invention, the junction between any adjacent gate electrodes need not be broad or protruded portions are formed as in the semiconductor device manufactured by the conventional method. Thus, the present invention can provide a semiconductor integrated circuit which can operate with high reliability and at high speed.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

The invention claimed is:

1. A semiconductor device comprising:
    a semiconductor substrate including a first and second region separated by an isolation element;
    a first transistor formed on the first region of the substrate and including a first insulation film and a first gate electrode arranged along a first direction; and
    a second transistor formed on the second region of the substrate and including a second insulation film and a second gate electrode arranged along the first direction,
    wherein a first side wall is located at an end of the first gate electrode in the first direction, a second side wall is located at an end of the second gate electrode in the first direction, and the first side wall is directly physically and without the presence of additional layers therebetween connected to the second side wall above the isolation element when viewed from a direction perpendicular to the first direction.

2. A device according to claim 1, wherein the side wall of the first gate electrode is directly connected to the side wall of the second gate electrode.

3. A device according to claim 2, wherein said second transistor further comprises a polysilicon layer formed on the second insulation film formed on the substrate, a side insulator film is formed on a side of the second insulation film and a side wall of the polysilicon layer, said second gate electrode is formed on the polysilicon layer, and the side wall of said first gate electrode is connected to the side wall of the second insulation film and the side wall of the polysilicon layer via the side insulator film.

4. A device according to claim 3, wherein a side of the side insulator film is on a surface of said semiconductor substrate.

5. A device according to claim 4, wherein at least one of said first and second gate electrodes is formed by a damascene gate process.

6. A device according to claim 3, wherein top surfaces of said first and second gate electrodes are coplanar.

7. A device according to claim 3, wherein said first insulation film is thinner than said second insulation film, said first transistor forms a logic circuit, and said second transistor forms a memory cell.

* * * * *

UNITED STATES PATENT AND TRADEMARK OFFICE
CERTIFICATE OF CORRECTION

| | |
|---|---|
| PATENT NO. | : 7,361,960 B1 |
| APPLICATION NO. | : 09/688989 |
| DATED | : April 22, 2008 |
| INVENTOR(S) | : Tsunashima et al. |

Page 1 of 1

It is certified that error appears in the above-identified patent and that said Letters Patent is hereby corrected as shown below:

Title page, item (30), line 3, change "Jun. 30, 1997" to --Jun. 30, 1998--.

Signed and Sealed this

Eighth Day of July, 2008

JON W. DUDAS
*Director of the United States Patent and Trademark Office*